United States Patent
Mayer et al.

(10) Patent No.: US 10,920,335 B2
(45) Date of Patent: *Feb. 16, 2021

(54) ELECTROPLATING APPARATUS FOR TAILORED UNIFORMITY PROFILE

(71) Applicant: Novellus Systems, Inc., Fremont, CA (US)

(72) Inventors: Steven T. Mayer, Aurora, OR (US); David W. Porter, Sherwood, OR (US); Bryan L. Buckalew, Tualatin, OR (US); Robert Rash, West Linn, OR (US)

(73) Assignee: Novellus Systems, Inc., Fremont, CA (US)

( * ) Notice: Subject to any disclaimer, the term of this patent is extended or adjusted under 35 U.S.C. 154(b) by 284 days.

This patent is subject to a terminal disclaimer.

(21) Appl. No.: 16/007,800

(22) Filed: Jun. 13, 2018

(65) Prior Publication Data

US 2018/0291517 A1 Oct. 11, 2018

Related U.S. Application Data

(63) Continuation of application No. 14/987,170, filed on Jan. 4, 2016, now Pat. No. 10,017,869, which is a (Continued)

(51) Int. Cl.
*C25D 17/00* (2006.01)
*C25D 5/18* (2006.01)
(Continued)

(52) U.S. Cl.
CPC ............ *C25D 17/001* (2013.01); *C25D 5/00* (2013.01); *C25D 5/04* (2013.01); *C25D 5/18* (2013.01);
(Continued)

(58) Field of Classification Search
None
See application file for complete search history.

(56) References Cited

U.S. PATENT DOCUMENTS

| 3,880,725 A | 4/1975 | Van Raalte et al. |
| 4,304,641 A | 12/1981 | Grandia et al. |
| (Continued) | | |

FOREIGN PATENT DOCUMENTS

| CA | 1236627 | 7/1986 |
| CN | 1531028 A | 9/2004 |
| (Continued) | | |

OTHER PUBLICATIONS

U.S. Office Action, dated Feb. 10, 2017, issued in U.S. Appl. No. 14/067,616.
(Continued)

*Primary Examiner* — Harry D Wilkins, III
(74) *Attorney, Agent, or Firm* — Weaver Austin Villeneuve & Sampson LLP

(57) ABSTRACT

Methods of electroplating metal on a substrate while controlling azimuthal uniformity, include, in one aspect, providing the substrate to the electroplating apparatus configured for rotating the substrate during electroplating, and electroplating the metal on the substrate while rotating the substrate relative to a shield such that a selected portion of the substrate at a selected azimuthal position dwells in a shielded area for a different amount of time than a second portion of the substrate having the same average arc length and the same average radial position and residing at a different angular (azimuthal) position. The shield is positioned in close proximity of the substrate (e.g., within a distance that is equal to 0.1 of the substrate's radius). The shield in some embodiments may be an ionically resistive
(Continued)

ionically permeable element having an azimuthally asymmetric distribution of channels.

19 Claims, 18 Drawing Sheets

Related U.S. Application Data continuation of application No. 14/483,942, filed on Sep. 11, 2014, now Pat. No. 9,260,793, which is a continuation of application No. 13/438,443, filed on Apr. 3, 2012, now Pat. No. 8,858,774, and a continuation-in-part of application No. 12/291,356, filed on Nov. 7, 2008, now Pat. No. 8,308,931.

(60) Provisional application No. 61/598,054, filed on Feb. 13, 2012, provisional application No. 61/471,624, filed on Apr. 4, 2011.

(51) Int. Cl.
    *C25D 17/12* (2006.01)
    *C25D 21/10* (2006.01)
    *C25D 21/12* (2006.01)
    *C25D 5/04* (2006.01)
    *C25D 5/00* (2006.01)
    *C25D 17/06* (2006.01)
    *C25D 7/12* (2006.01)
    *H01L 21/288* (2006.01)
    *H01L 21/768* (2006.01)

(52) U.S. Cl.
    CPC ......... *C25D 17/002* (2013.01); *C25D 17/007* (2013.01); *C25D 17/008* (2013.01); *C25D 17/06* (2013.01); *C25D 17/12* (2013.01); *C25D 21/10* (2013.01); *C25D 21/12* (2013.01); *H01L 21/2885* (2013.01); *C25D 7/123* (2013.01); *H01L 21/76873* (2013.01)

(56) References Cited

U.S. PATENT DOCUMENTS

| | | |
|---|---|---|
| 4,696,729 A | 9/1987 | Santini |
| 5,078,852 A | 1/1992 | Yee et al. |
| 5,169,684 A | 12/1992 | Takagi |
| 5,312,352 A | 5/1994 | Leschinsky et al. |
| 5,312,532 A | 5/1994 | Andricacos et al. |
| 5,620,581 A | 4/1997 | Ang |
| 5,723,028 A | 3/1998 | Poris |
| 5,744,019 A | 4/1998 | Ang |
| 5,774,019 A | 6/1998 | Koyama et al. |
| 6,004,440 A | 12/1999 | Hanson et al. |
| 6,027,631 A | 2/2000 | Broadbent |
| 6,071,388 A | 6/2000 | Uzoh |
| 6,074,544 A | 6/2000 | Reid et al. |
| 6,099,702 A | 8/2000 | Reid et al. |
| 6,106,687 A | 8/2000 | Edelstein |
| 6,110,346 A | 8/2000 | Reid et al. |
| 6,126,798 A | 10/2000 | Reid et al. |
| 6,132,587 A | 10/2000 | Jorne et al. |
| 6,132,805 A | 10/2000 | Moslehi |
| 6,139,703 A | 10/2000 | Hanson et al. |
| 6,156,167 A | 12/2000 | Patton et al. |
| 6,162,344 A | 12/2000 | Reid et al. |
| 6,168,693 B1 | 1/2001 | Uzoh et al. |
| 6,174,425 B1 | 1/2001 | Simpson et al. |
| 6,179,983 B1 | 1/2001 | Reid et al. |
| 6,193,860 B1 | 2/2001 | Weling |
| 6,228,231 B1 | 5/2001 | Uzoh |
| 6,261,433 B1 | 7/2001 | Landau |
| 6,322,674 B1 | 11/2001 | Berner et al. |
| 6,391,166 B1 | 5/2002 | Wang |
| 6,391,168 B1 | 5/2002 | Ueno |
| 6,402,923 B1 | 6/2002 | Mayer et al. |
| 6,425,991 B1 | 7/2002 | Tran et al. |
| 6,497,801 B1 | 12/2002 | Woodruff et al. |
| 6,514,393 B1 | 2/2003 | Contolini et al. |
| 6,527,920 B1 | 3/2003 | Mayer et al. |
| 6,551,483 B1 | 4/2003 | Mayer et al. |
| 6,569,299 B1 | 5/2003 | Reid et al. |
| 6,599,412 B1 | 7/2003 | Graham et al. |
| 6,627,051 B2 | 9/2003 | Berner et al. |
| 6,627,052 B2 | 9/2003 | Fluegel et al. |
| 6,632,335 B2 | 10/2003 | Kunisawa et al. |
| 6,716,334 B1 | 4/2004 | Reid et al. |
| 6,755,954 B2 | 6/2004 | Mayer et al. |
| 6,773,571 B1 | 8/2004 | Mayer et al. |
| 6,800,187 B1 | 10/2004 | Reid et al. |
| 6,843,894 B2 | 1/2005 | Berner et al. |
| 6,919,010 B1 | 7/2005 | Mayer et al. |
| 6,988,932 B2 | 1/2006 | Ashjaee et al. |
| 7,288,177 B2 | 10/2007 | Barrese et al. |
| 7,323,094 B2 | 1/2008 | Simpson et al. |
| 7,383,521 B2 | 6/2008 | Smith et al. |
| 7,622,024 B1 | 11/2009 | Mayer et al. |
| 7,682,498 B1 | 3/2010 | Mayer et al. |
| 7,727,364 B2 | 6/2010 | Singh et al. |
| 7,737,035 B1 | 6/2010 | Lind et al. |
| 7,837,841 B2 | 11/2010 | Chen et al. |
| 7,854,828 B2 | 12/2010 | Reid et al. |
| 7,967,969 B2 | 6/2011 | Mayer et al. |
| 8,262,871 B1 | 9/2012 | Mayer et al. |
| 8,308,931 B2 | 11/2012 | Reid et al. |
| 8,475,636 B2 | 7/2013 | Mayer et al. |
| 8,475,637 B2 | 7/2013 | Mayer et al. |
| 8,475,644 B2 | 7/2013 | Mayer et al. |
| 8,603,305 B2 | 12/2013 | Rash et al. |
| 8,795,480 B2 | 8/2014 | Mayer et al. |
| 8,858,774 B2 | 10/2014 | Mayer et al. |
| 9,260,793 B2 | 2/2016 | Mayer et al. |
| 9,309,604 B2 | 4/2016 | Mayer et al. |
| 9,567,685 B2 | 2/2017 | Kagajawala et al. |
| 9,752,248 B2 | 9/2017 | Kagajawala et al. |
| 9,822,461 B2 | 11/2017 | He et al. |
| 9,909,228 B2 | 3/2018 | He |
| 9,988,733 B2 | 6/2018 | Graham et al. |
| 10,017,869 B2* | 7/2018 | Mayer .................. C25D 17/007 |
| 10,023,970 B2 | 7/2018 | He et al. |
| 2002/0017456 A1 | 2/2002 | Graham et al. |
| 2002/0020627 A1 | 2/2002 | Kunisawa et al. |
| 2002/0046952 A1 | 4/2002 | Graham et al. |
| 2002/0079230 A1 | 6/2002 | Basol et al. |
| 2002/0119671 A1 | 8/2002 | Lee |
| 2002/0125141 A1 | 9/2002 | Wilson et al. |
| 2002/0195352 A1 | 12/2002 | Mayer et al. |
| 2003/0038035 A1 | 2/2003 | Wilson et al. |
| 2003/0079995 A1 | 5/2003 | Contolini et al. |
| 2003/0168340 A1 | 9/2003 | Kaja et al. |
| 2003/0201166 A1 | 10/2003 | Zheng et al. |
| 2004/0026257 A1 | 2/2004 | Gonzalez, Jr. et al. |
| 2004/0084316 A1 | 5/2004 | Muranaka |
| 2004/0094427 A1 | 5/2004 | Economikos et al. |
| 2004/0149584 A1 | 8/2004 | Nagai et al. |
| 2005/0109627 A1 | 5/2005 | Sun et al. |
| 2005/0145499 A1 | 7/2005 | Kovarsky et al. |
| 2005/0164498 A1 | 7/2005 | Ide et al. |
| 2006/0201814 A1 | 9/2006 | Hafezi et al. |
| 2006/0243598 A1 | 11/2006 | Singh et al. |
| 2007/0029193 A1 | 2/2007 | Brcka |
| 2008/0179180 A1 | 7/2008 | McHugh et al. |
| 2008/0223724 A1 | 9/2008 | Chen et al. |
| 2009/0068771 A1 | 3/2009 | Chae et al. |
| 2010/0032303 A1 | 2/2010 | Reid et al. |
| 2010/0032304 A1 | 2/2010 | Mayer et al. |
| 2010/0032310 A1 | 2/2010 | Reid et al. |
| 2010/0044236 A1 | 2/2010 | Mayer et al. |
| 2010/0116672 A1 | 5/2010 | Mayer et al. |
| 2011/0209991 A1 | 9/2011 | Gebhart et al. |
| 2012/0000786 A1 | 1/2012 | Mayer et al. |
| 2012/0061246 A1 | 3/2012 | Feng et al. |
| 2012/0258408 A1 | 10/2012 | Mayer et al. |

(56) References Cited

U.S. PATENT DOCUMENTS

| | | | |
|---|---|---|---|
| 2013/0137242 | A1 | 5/2013 | He et al. |
| 2013/0313123 | A1 | 11/2013 | Abraham et al. |
| 2013/0327650 | A1 | 12/2013 | Mayer et al. |
| 2014/0144781 | A1 | 5/2014 | He |
| 2014/0231245 | A1 | 8/2014 | Sandmann et al. |
| 2015/0060291 | A1 | 3/2015 | Mayer et al. |
| 2016/0115611 | A1 | 4/2016 | Mayer et al. |
| 2016/0177466 | A1 | 6/2016 | Kagajawala et al. |
| 2016/0215408 | A1 | 7/2016 | Kagajwala et al. |
| 2017/0096745 | A9 | 4/2017 | He et al. |
| 2018/0057955 | A1 | 3/2018 | He et al. |
| 2018/0142374 | A1 | 5/2018 | He |
| 2018/0312991 | A1 | 11/2018 | Graham et al. |

FOREIGN PATENT DOCUMENTS

| | | |
|---|---|---|
| CN | 1624207 A | 6/2005 |
| CN | 1705774 A | 12/2005 |
| CN | 101056718 A | 10/2007 |
| CN | 100487855 C | 5/2009 |
| CN | 101736376 A | 6/2010 |
| CN | 102330140 A | 1/2012 |
| CN | 102459717 B | 12/2014 |
| DE | 3712259 A1 | 10/1998 |
| EP | 1179617 A1 | 2/2002 |
| JP | H02-136062 U | 11/1990 |
| JP | H04-143299 A | 5/1992 |
| JP | H07197299 A | 8/1995 |
| JP | H10-130896 A | 5/1998 |
| JP | 2000-195823 A | 7/2000 |
| JP | 2002-506488 A | 2/2002 |
| JP | 2003-510456 A | 3/2003 |
| JP | 2003-129294 A | 5/2003 |
| JP | 2003-268591 | 9/2003 |
| JP | 2004-518817 A | 6/2004 |
| JP | 2005-171317 A | 6/2005 |
| JP | 2007-204832 A | 8/2007 |
| JP | 2008-013801 A | 1/2008 |
| JP | 2011-063849 A | 3/2011 |
| KR | 1020010014062 A | 2/2001 |
| KR | 10-2007-00227753 A | 3/2007 |
| KR | 10-0707121 | 4/2007 |
| KR | 10-2010-0051843 A | 5/2010 |
| KR | 10-2012-0029468 A | 3/2012 |
| TW | 223678 | 11/2004 |
| TW | 201107536 A | 3/2011 |
| WO | WO 99/14401 | 3/1999 |
| WO | WO 99/64647 | 12/1999 |
| WO | WO 2004/009879 | 1/2004 |
| WO | WO 2005/043593 | 5/2005 |
| WO | WO 2010/144330 | 12/2010 |

OTHER PUBLICATIONS

U.S. Final Office Action, dated Jul. 7, 2017, issued in U.S. Appl. No. 14/067,616.
U.S. Notice of Allowance, dated Oct. 20, 2017, issued in U.S. Appl. No. 14/067,616.
U.S. Office Action, dated Nov. 9, 2016, issued in U.S. Appl. No. 14/578,068.
U.S. Notice of Allowance, dated May 3, 2017, issued in U.S. Appl. No. 14/578,068.
U.S. Notice of Allowance [Corrected Notice of Allowability], dated Jun. 21, 2017, issued in U.S. Appl. No. 14/578,068.
U.S. Office Action, dated Jun. 16, 2016, issued in U.S. Appl. No. 14/602,910.
U.S. Notice of Allowance, dated Oct. 6, 2016, issued in U.S. Appl. No. 14/602,910.
U.S. Office Action, dated May 26, 2010, issued in U.S. Appl. No. 11/506,054.
U.S. Notice of Allowance, dated Aug. 13, 2010, issued in U.S. Appl. No. 11/506,054.
U.S. Office Action, dated Sep. 19, 2011, issued in U.S. Appl. No. 12/291,356.
U.S. Final Office Action, dated Feb. 27, 2012, issued in U.S. Appl. No. 12/291,356.
U.S. Notice of Allowance, dated Jul. 27, 2012, issued in U.S. Appl. No. 12/291,356.
U.S. Office Action, dated Jun. 24, 2011, issued in U.S. Appl. No. 12/481,503.
U.S. Final Office Action, dated Mar. 1, 2012, issued in U.S. Appl. No. 12/481,503.
U.S. Office Action, dated Jul. 9, 2012, issued in U.S. Appl. No. 12/481,503.
U.S. Final Office Action, dated Dec. 19, 2012, issued in U.S. Appl. No. 12/481,503.
U.S. Notice of Allowance dated Mar. 1, 2013 issued in U.S. Appl. No. 12/481,503.
U.S. Office Action, dated Jun. 24, 2011, issued in U.S. Appl. No. 12/606,030.
U.S. Final Office Action, dated Mar. 1, 2012, issued in U.S. Appl. No. 12/606,030.
U.S. Office Action, dated Jun. 28, 2012, issued in U.S. Appl. No. 12/606,030.
U.S. Office Action, dated Jul. 13, 2012, issued in U.S. Appl. No. 12/606,030.
U.S. Final Office Action, dated Dec. 17, 2012, issued in U.S. Appl. No. 12/606,030.
U.S. Notice of Allowance dated Mar. 1, 2013, issued in U.S. Appl. No. 12/606,030.
U.S. Office Action, dated Jul. 29, 2015, issued in U.S. Appl. No. 13/907,265.
U.S. Notice of Allowance, dated Dec. 30, 2015, issued in U.S. Appl. No. 13/907,265.
U.S. Office Action, dated Feb. 25, 2014, issued in U.S. Appl. No. 13/438,443.
U.S. Notice of Allowance, dated Jun. 11, 2014, issued in U.S. Appl. No. 13/438,443.
U.S. Notice of Allowance, dated Oct. 2, 2015, issued in U.S. Appl. No. 14/483,942.
U.S. Notice of Allowance [Corrected Notice of Allowability], dated Nov. 10, 2015, issued in U.S. Appl. No. 14/483,942.
U.S. Notice of Allowance [Corrected Notice of Allowability], dated Jan. 20, 2016, issued in U.S. Appl. No. 14/483,942.
U.S. Office Action dated Oct. 3, 2017, issued in U.S. Appl. No. 14/987,170.
U.S. Notice of Allowance dated Mar. 14, 2018 issued in U.S. Appl. No. 14/987,170.
U.S. Office Action, dated Jan. 15, 2016, issued in U.S. Appl. No. 13/687,937.
U.S. Final Office Action, dated May 1, 2017, issued in U.S. Appl. No. 13/687,937.
U.S. Notice of Allowance, dated Aug. 1, 2017, issued in U.S. Appl. No. 13/687,937.
U.S. Notice of Allowance dated Mar. 13, 2018 issued in U.S. Appl. No. 15/787,580.
Chinese First Office Action dated May 15, 2013 issued in Application No. CN 200910209697.2.
Chinese Second Office Action dated Dec. 10, 2013 issued in Application No. CN 200910209697.2.
PCT International Search Report and Written Opinion, dated Jan. 12, 2011, issued in PCT/US2010/037520.
PCT International Preliminary Report on Patentability and Written Opinion, dated Dec. 22, 2011, issued in PCT/US2010/037520.
Chinese First Office Action dated Nov. 6, 2013 issued in Application No. CN 201080032109.3.
Chinese Second Office Action dated Jun. 10, 2014 issued in Application No. CN 201080032109.3.
Korean First Office Action dated Jun. 23, 2016 issued in Application No. KR 10-2012-7000614.
Taiwan Office Action dated Jul. 31, 2014 issued in Application No. TW 099118603.
Chinese First Office Action dated Oct. 13, 2015 issued in Application No. CN 201210098129.1.

(56) References Cited

OTHER PUBLICATIONS

Chinese Second Office Action dated Jun. 6, 2016 issued in Application No. CN 201210098129.1.
Chinese Third Office Action dated Nov. 18, 2016 issued in Application No. CN 201210098129.1.
Taiwan Office Action dated Nov. 10, 2015 issued in Application No. TW 101111926.
Chinese Fourth Office Action dated May 31, 2017 issued in Application No. CN 201210098129.1.
Chinese First Office Action dated Mar. 31, 2017 issued in Application No. CN 201510556374.6.
Chinese Second Office Action dated Nov. 23, 2017 issued in Application No. CN 201510556374.6.
Korean First Office Action dated Apr. 10, 2018 issued in Application No. KR 10-2012-0035111.
Taiwan Office Action dated Aug. 2, 2016 issued in Application No. TW 101144354.
Japanese Office Action dated Nov. 28, 2017 issued in Application No. JP 2013-239467.
Taiwan First Office Action dated Feb. 18, 2017 issued in Application No. TW 102142332.
Taiwan Second Office Action dated Nov. 29, 2017 issued in Application No. TW 102142332.
Taiwan Notice of Allowance dated Apr. 3, 2018 issued in Application No. TW 102142332.
Chinese First Office Action dated Jul. 4, 2017 issued in Application No. CN 201610027064.X.
"Release of Sabre™ electrofill tool with HRVA by Novellus Systems, Inc." no earlier than Aug. 2005. (3 pages).
U.S. Office Action, dated Aug. 5, 2019, issued in U.S. Appl. No. 15/971,956.
U.S. Final Office Action, dated Nov. 19, 2019, issued in U.S. Appl. No. 15/971,956.
U.S. Office Action, dated Mar. 4, 2020, issued in U.S. Appl. No. 15/971,956.
Chinese Second Office Action dated Nov. 5, 2018 issued in Application No. CN 201610394032.3.
Taiwan Office Action dated Dec. 9, 2019 issued in Application No. TW Application No. 105117111.
Korean First Office Action dated Feb. 6, 2020 issued in Application No. KR 10-2019-0145020.
Chinese First Office Action dated Feb. 27, 2019 issued in Application No. CN 201711259887.6.
Korean Decision to Grant dated Aug. 16, 2019 issued in Application No. KR 10-2019-0068724.
U.S. Office Action, dated Nov. 12, 2019, issued in U.S. Appl. No. 15/873,660.
Korean First Office Action dated Mar. 6, 2019 issued in Application No. KR 10-2012-0137431.
Korean Decision for Grant dated Jun. 18, 2019 issued in Application No. KR 10-2012-0137431.
Japanese Decision for Grant dated Oct. 2, 2018 issued in Application No. JP 2013-239467.
Korean First Office Action dated Nov. 8, 2019 issued in Application No. KR 10-2013-0145765.
Korean Decision for Grant dated Feb. 5, 2020 issued in Application No. KR 10-2013-0145765.
Chinese First Office Action dated Sep. 23, 2019 issued in Application No. CN 201810358910.5.
Taiwanese First Office Action dated Sep. 6, 2019 issued in Application No. TW 105101791.
Chinese Office Action dated Nov. 25, 2020 in CN Application No. 201910553235.6.

\* cited by examiner

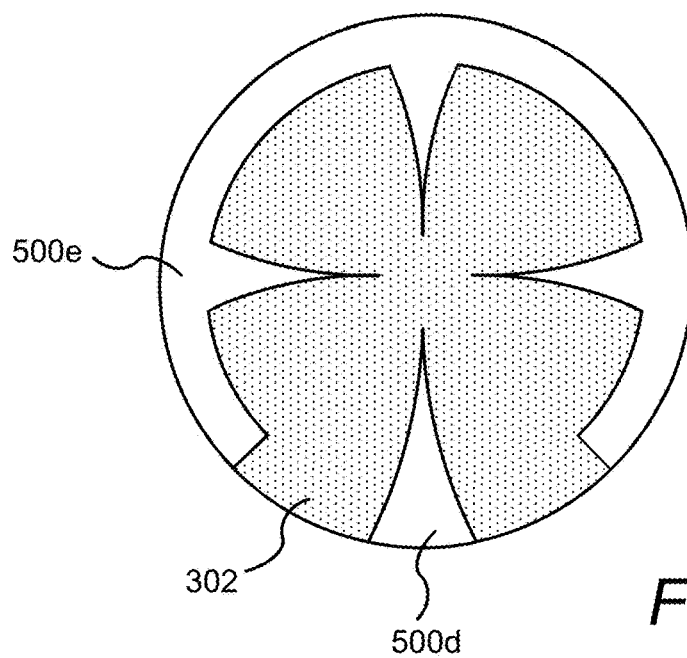
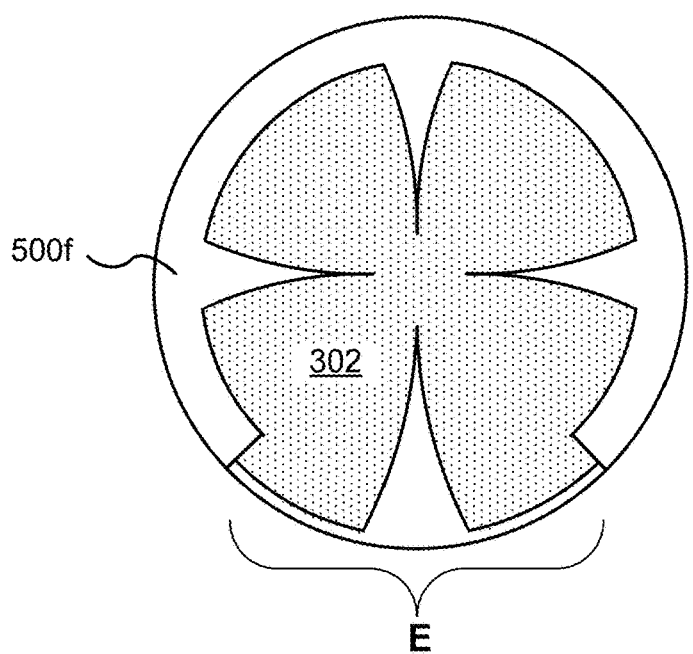
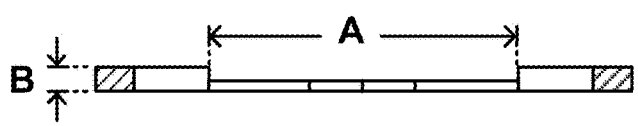
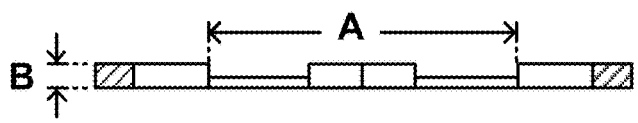
Fig. 5C
Fig. 5D

ELECTROPLATING APPARATUS FOR TAILORED UNIFORMITY PROFILE

CROSS-REFERENCE TO RELATED APPLICATIONS

This application is a continuation claiming priority to U.S. patent application Ser. No. 14/987,170, titled "Electroplating Apparatus for Tailored Uniformity Profile" naming Mayer et al. as inventors, filed Jan. 4, 2016 (issued as U.S. Pat. No. 10,017,869 on Jul. 10, 2018), which is a continuation claiming priority to U.S. patent application Ser. No. 14/483,942, titled "Electroplating Apparatus for Tailored Uniformity Profile" naming Mayer et al. as inventors, filed Sep. 11, 2014 (issued as U.S. Pat. No. 9,260,793 on Feb. 16, 2016), which is a continuation claiming priority to U.S. patent application Ser. No. 13/438,443, titled "Electroplating Apparatus for Tailored Uniformity Profile" naming Mayer et al. as inventors, filed Apr. 3, 2012 (issued as U.S. Pat. No. 8,858,774 on Oct. 14, 2014), which claims benefit under 35 U.S.C. § 119(e) to U.S. Provisional Patent Application No. 61/471,624, titled "Electroplating Apparatus for Tailored Uniformity Profile", naming Mayer et al. as inventors, filed Apr. 4, 2011 and to U.S. Provisional Patent Application No. 61/598,054, titled "Electroplating Apparatus for Uniform Electrolyte Flow Distribution" naming Buckalew et al. as inventors, filed Feb. 13, 2012, which are herein incorporated by reference. U.S. patent application Ser. No. 13/438,443 is also a continuation-in-part claiming priority to U.S. patent application Ser. No. 12/291,356, titled "Method and Apparatus for Electroplating" naming Reid et al. as inventors, filed Nov. 7, 2008, now U.S. Pat. No. 8,308,931, issued Nov. 13, 2012, which is herein incorporated by reference.

FIELD OF THE INVENTION

The present disclosure relates generally to method and apparatus for electroplating a metal layer on a semiconductor wafer. More particularly, the method and apparatus described herein are useful for controlling plating uniformity.

BACKGROUND

The transition from aluminum to copper in integrated circuit (IC) fabrication required a change in process "architecture" (to damascene and dual-damascene) as well as a whole new set of process technologies. One process step used in producing copper damascene circuits is the formation of a "seed-" or "strike-" layer, which is then used as a base layer onto which copper is electroplated ("electrofill"). The seed layer carries the electrical plating current from the edge region of the wafer (where electrical contact is made) to all trenches and via structures located across the wafer surface. The seed film is typically a thin conductive copper layer. It is separated from the insulating silicon dioxide or other dielectric by a barrier layer. The seed layer deposition process should yield a layer which has good overall adhesion, excellent step coverage (more particularly, conformal/continuous amounts of metal deposited onto the side-walls of an embedded structure), and minimal closure or "necking" of the top of the embedded feature.

Market trends of increasingly smaller features and alternative seeding processes drive the need for a capability to plate with a high degree of uniformity on increasingly thin seeded wafers. In the future, it is anticipated that the seed film may simply be composed of a plateable barrier film, such as ruthenium, or a bilayer of a very thin barrier and copper (deposited, for example, by an atomic layer deposition (ALD) or similar process). Such films present the engineer with an extreme terminal effect situation. For example, when driving a 3 amp total current uniformly into a 30 ohm per square ruthenium seed layer (a likely value for a 30-50 Å film) the resultant center to edge (radial) voltage drop in the metal will be over 2 volts. To effectively plate a large surface area, the plating tooling makes electrical contact to the conductive seed only in the edge region of the wafer substrate. There is no direct contact made to the central region of the substrate. Hence, for highly resistive seed layers, the potential at the edge of the layer is significantly greater than at the central region of the layer. Without appropriate means of resistance and voltage compensation, this large edge-to-center voltage drop could lead to an extremely non-uniform plating rate and non-uniform plating thickness distribution, primarily characterized by thicker plating at the wafer edge. This plating non-uniformity is radial non-uniformity, that is, uniformity variation along a radius of the circular wafer.

Another type of non-uniformity, which needs to be mitigated, is azimuthal non-uniformity. For clarity, we define azimuthal non-uniformity, using polar coordinates, as thickness variations exhibited at different angular positions on the workpiece at a fixed radial position from the wafer center, that is, a non-uniformity along a given circle or portion of a circle within the perimeter of the wafer. This type of non-uniformity can be present in electroplating applications, independently of radial non-uniformity, and in some applications may be the predominant type of non-uniformity that needs to be controlled. It often arises in through resist plating, where a major portion of the wafer is masked with a photoresist coating or similar plating-preventing layer, and the masked pattern of features or feature densities are not azmuthally uniform near the wafer edge. For example, in some cases there may be a technically required chord-region of missing pattern features near the notch of the wafer to allow for wafer numbering or handling. The radially and azimuthally variable plating rates inside missing region may cause chip die to be non-functional, therefore methods and apparatus for avoiding this situation are needed.

Electrochemical deposition is now poised to fill a commercial need for sophisticated packaging and multichip interconnection technologies known generally as wafer level packaging (WLP) and through silicon via (TSV) electrical connection technology. These technologies present their own very significant challenges.

These technologies require electroplating on a significantly larger size scale than damascene applications. Depending on the type and application of the packaging features (e.g. through chip connecting TSV, interconnection redistribution wiring, or chip to board or chip bonding, such as flip-chip pillars), plated features are usually, in current technology, greater than about 2 micrometers in diameter and typically are 5-100 micrometers in diameter (for example, pillars may be about 50 micrometers). For some on-chip structures such as power busses, the feature to be plated may be larger than 100 micrometers. The aspect ratios of the WLP features are typically about 2:1 (height to width) or lower, more typically 1:1 or lower, while TSV structures can have very high aspect ratios (e.g., in the neighborhood of about 10:1 or 20:1).

Given the relatively large amount of material to be deposited, not only feature size, but also plating speed differentiates WLP and TSV applications from damascene applications. For many WLP applications, plating must fill features at a rate of at least about 2 micrometers/minute, and typically at least about 4 micrometers/minute, and for some applications at least about 7 micrometers/minute. The actual rates will vary depending on the particular metal being deposited. But at these higher plating rate regimes, efficient mass transfer of metal ions in the electrolyte to the plating surface is very important. Higher plating rates present challenges with respect to uniformity of the electrodeposited layer.

SUMMARY OF THE INVENTION

Described are method and apparatus for controlling plating uniformity, particularly, azimuthal non-uniformity, radial non-uniformity, or both. Apparatus and methods described herein can be used for electroplating on a variety of substrates, including semiconductor wafer substrates having TSV or WLP recessed features.

In some embodiments, a method for electroplating an asymmetrical plating workpiece (including a geometrically symmetrical workpiece substrate whose exposed area to be plated is asymmetrical, such as a wafer with an azimuthally non-uniformly patterning), is provided. The asymmetry refers not only to purely geometric asymmetry of the substrate (such as presence of a notch, or a flat region cut along a chord), but also to asymmetry within the features on the substrate, which may result in unwanted ionic current crowding during plating, and lead to increased plating at certain azimuthal regions of the wafer. For example, in some embodiments electroplating is performed on a substrate having a missing die. Electroplating on such substrate leads to current crowding in the areas that are adjacent to the azimuthal variable patterning discontinuities at the periphery, such as a region with missing features and missing die, and, consequently, to plating non-uniformity in this region.

Provided methods and apparatus, in some embodiments, employ azimuthally asymmetric shields—shields that provide shielding from the plating (ionic) current to a greater degree at some azimuthal (angular) positions than at other azimuthal (angular) positions, at least at one of radial positions.

Provided methods and apparatus, in some embodiments, employ azimuthally asymmetric auxiliary electrodes—electrodes configured to divert plating current (auxiliary cathodes or thieves), to donate plating current (auxiliary anodes), or to both donate and divert current at different time points (referred to as anode/cathodes), where the electrodes are shaped or confined such as to predominantly modify current to a greater degree at some azimuthal (angular) positions in preference to other positions.

An example of an azimuthally asymmetric electrode is a C-shaped electrode (a cathode, anode, or an anode/cathode). The C-shaped electrode, is located, in some embodiments, relatively close to the wafer substrate (e.g., within a distance of not greater than 0.2 of the radius of the wafer), and is electrically connected to a power supply and a controller, which, in some embodiments, provide for it being energized in correlation with rotation of the wafer. In some embodiments the body of the C-shaped electrode, preferably, has an arc length of less than about 120 degrees, such as less than about 90 degrees.

In one aspect, provided methods and apparatus employ azimuthally asymmetric shields and/or azimuthally asymmetric auxiliary electrodes and/or multi-segmented auxiliary electrodes, where rotation of the wafer is adjusted such that different angular (azimuthal) positions of the wafer have different dwell times in the shielded area or in the area proximate the auxiliary electrode or its segment.

Thus, for example, a missing die area may spend more time, on average, in a relatively more shielded area than an equivalent portion of the wafer at a different angular (azimuthal) position but having the same average arc length and same average radial position.

In another aspect, provided methods and apparatus employ azimuthally asymmetric auxiliary electrodes and/or multi-segmented auxiliary electrodes, where the electrodes are energized in correlation with the rotation of the wafer such that different angular (azimuthal) positions of the wafer are exposed to different amounts of plating current being donated and/or diverted by an auxiliary electrode (or electrode segment).

For example, a C-shaped auxiliary electrode may be energized in correlation with the rotating wafer, e.g., such as when the missing die region of the wafer passes through proximity of the C-shaped electrode, the electrode may be energized at a first level (e.g., to divert current at a first level), while it is energized at a different level, or not energized, or energized to have an opposite polarity, when other azimuthal (angular) positions of the wafer pass through its proximity during the course of wafer rotation. The terms angular and azimuthal positions are synonymous and can be used interchangeably.

It should be understood that the all secondary or auxiliary electrode functionality described herein can be operated as either anodes, cathodes, or both. The anode may be an inert anode or dimensionally stable anode, for example generating oxygen gas, or it can be a metallic anode, creating metal ions. The cathode may have metal plating thereupon, or may undergo another cathodic reaction, such as hydrogen evolution (e.g. if plateable metal ions are excluded from the electrode's surface). The electrode may, in some embodiments, combine two or more of the above processes, changing in time during a wafer plating cycle (an anode/cathode). Therefore, while some embodiments described herein, are exemplified, by thief cathodes, it is understood that all of these embodiments can be used not only with thief cathodes, but with other types of auxiliary electrodes, including anodes (positively biased electrodes configured for donating plating current) and anode/cathodes (electrodes, which can be biased both negatively and positively, at different time points as desired). The auxiliary electrodes may be energized either continuously or for some portion of the rotation of the wafer.

Further, while it may not be mentioned with each of the methods described, preferably each method includes an operation prior to electroplating in which the desired azimuthal position of the substrate is registered (e.g., by an optical device), such that this position is known, and such that the apparatus could be programmed, such as to provide appropriate plating current correction for this specific position (or for a different position residing at a certain angle from the known position) during the course of electroplating. The registration of the selected angular position (e.g., a notch) can be performed in the electroplating apparatus, or in a different apparatus, as long as the recorded position remains known, up to the point of electroplating.

In one aspect, a method of electroplating a metal on a cathodically biased substrate while controlling azimuthal uniformity, includes providing the substrate into an electroplating apparatus configured for rotating the substrate during electroplating, wherein the apparatus comprises an anode and a stationary auxiliary azimuthally asymmetric electrode; and electroplating the metal on the substrate while rotating the substrate, and while providing power to the auxiliary azimuthally asymmetric electrode in correlation with the rotation of the substrate, such that the auxiliary azimuthally asymmetric electrode diverts and/or donates plating current to a first portion of the substrate at a selected azimuthal position of the substrate differently than to a second portion of the substrate having the same average arc length and the same average radial position and residing at a different azimuthal angular position.

It is understood that providing desired power to the auxiliary electrode can be achieved by controlling current, voltage or combination thereof from a power supply electrically connected to the auxiliary electrode. The auxiliary electrode can be energized such that a different current is applied to it when the selected azimuthal position passes in its proximity, while the auxiliary electrode may be energized by a different level of current, not energized at all, or energized at a different polarity, when other angular positions of the wafer pass through its proximity. Typically, during one full rotation of the wafer the auxiliary electrode passes through at least two distinct states (e.g., energized by different levels of current, energized at different polarities, or energized/non-energized states).

In some embodiments the azimuthally asymmetric electrode is C-shaped. In some embodiments the electrode may reside in an azimuthal current flow confinement structure. If the confinement structure provides an exposure of plating current (e.g., through a slot or a series of openings) that approximates a C-shape, the auxiliary electrode itself may have a variety of shapes, because the modification of plating current by the auxiliary electrode will be governed by the exposure created by the confinement structure. In some embodiments, the auxiliary azimuthally asymmetric electrode is housed in a separate chamber and the exposure of plating current from the auxiliary electrode is through at least one channel that delivers current into a region of the cell near the periphery of the substrate over an arc angle of less than about 120 degrees.

In some embodiments, the auxiliary azimuthally asymmetric electrode is cathodically biased and is configured to divert different amounts of plating current from different azimuthal positions of the substrate during electroplating. For example, during one full rotation of the wafer, the electrode may accept a first level of cathodic current (when the selected angular position of the rotating wafer passes in its proximity) and then a different (lower or higher) level of current (when a different angular position passes through its proximity). In another example, during one full rotation of the wafer, the electrode may accept a first level of cathodic current (when the selected angular position of the rotating wafer passes in its proximity) and then may remain non-energized (when a different angular position passes through its proximity).

In other embodiments, the auxiliary azimuthally asymmetric electrode is anodically biased and is configured to donate different amounts of plating current to different azimuthal positions of the substrate during electroplating. For example, during one full rotation of the wafer, the electrode may accept a first level of anodic current (when the selected angular position of the rotating wafer passes in its proximity) and then a different (lower or higher) level of current (when a different angular position passes through its proximity). In another example, during one full rotation of the wafer, the electrode may accept a first level of anodic current (when the selected angular position of the rotating wafer passes in its proximity) and then may remain non-energized (when a different angular position passes through its proximity).

In other embodiments, the auxiliary azimuthally asymmetric electrode is both anodically and cathodically biased during electroplating, and is configured to divert plating current from a first azimuthal position on the substrate and to donate plating current to a second azimuthal position on the substrate. For example, during one full rotation of the wafer, the electrode may accept a level of anodic current (when the selected angular position of the rotating wafer passes in its proximity) and then a level of cathodic current (when a different angular position of the rotating wafer passes through its proximity). Such anode/cathode is typically electrically connected to a bipolar power supply, which is configured to change polarity of the auxiliary electrode, as necessary.

In some embodiments, the electroplating apparatus includes a shield, shielding the periphery of the substrate at all azimuthal positions, and the auxiliary azimuthally asymmetric electrode is anodically biased at least during a portion of a time of a full rotation of the substrate, and is configured to donate current to the selected azimuthal position on the substrate. By using the azimuthally symmetrical shield, the entire periphery of the wafer may be lacking in plating current, which can be corrected by donating plating current at different levels to different angular positions, by an auxiliary anode.

In another aspect, a method of electroplating a metal on a cathodically biased substrate includes providing the substrate into an electroplating apparatus configured for rotating the substrate during electroplating, wherein the apparatus comprises an auxiliary azimuthally asymmetric or multi-segmented anode in the proximity of the substrate; and electroplating the metal on the substrate while rotating the substrate, and while providing power to the auxiliary azimuthally asymmetric anode at a substantially constant level to donate current to the substrate.

In another aspect an electroplating apparatus for electroplating a metal on a substrate is provided, where the apparatus includes a plating chamber configured to contain an electrolyte, an anode, and an azimuthally asymmetric auxiliary electrode; a substrate holder configured to hold the substrate; and a controller comprising program instructions for electroplating the metal on the substrate while rotating the substrate, and while providing power to the auxiliary azimuthally asymmetric electrode in correlation with the rotation of the substrate, such that the auxiliary azimuthally asymmetric electrode diverts and/or donates plating current to a first portion of the substrate at a selected azimuthal position of the substrate differently than to a second portion of the substrate having the same average arc length and the same average radial position and residing at a different angular azimuthal position. In some embodiments this apparatus is integrated into a system configured for photolithographic processing which further includes a stepper.

In another aspect a non-transitory computer machine-readable medium comprising program instructions for control of an electroplating apparatus is provided, wherein the program instructions include code for electroplating the metal on the substrate while rotating the substrate, and while providing power to the auxiliary azimuthally asymmetric electrode in correlation with the rotation of the substrate, such that the auxiliary azimuthally asymmetric electrode diverts and/or donates plating current to a first portion of the substrate at a selected azimuthal position of the substrate differently than to a second portion of the substrate having the same average arc length and the same average radial position and residing at a different angular azimuthal position.

In some embodiments the methods provided herein are integrated into the general processing schemes that include photolithographic processing, and further include the steps of. applying photoresist to the substrate; exposing the photoresist to light; patterning the resist and transferring the pattern to the workpiece; and selectively removing the photoresist from the work piece. In some embodiments, the photoresist is applied and patterned prior to electroplating and is removed after electroplating.

In another aspect, an electroplating apparatus for electroplating a metal on a substrate, is provided, wherein the apparatus includes: a plating chamber configured to contain an electrolyte; a substrate holder configured to hold and rotate the substrate during electroplating; an anode; and an azimuthally asymmetric auxiliary electrode configured to be biased both anodically and cathodically during electroplating.

In another aspect an electroplating apparatus for electroplating a metal on a substrate is provided, wherein the apparatus includes: a plating chamber configured to contain an electrolyte; a substrate holder configured to hold and rotate the substrate during electroplating; an anode; a shield configured to shield current at the periphery of the substrate; and an azimuthally asymmetric auxiliary anode configured to donate current to the shielded periphery of the substrate at a selected azimuthal position on the substrate.

In another aspect an electroplating apparatus for electroplating a metal on a substrate is provided, where the apparatus includes: a plating chamber configured to contain an electrolyte; a substrate holder configured to hold and rotate the substrate during electroplating; an anode; and a multi-segmented auxiliary electrode configured to be biased both anodically and cathodically during electroplating, or a multi-segmented auxiliary anode.

In another aspect, a method of electroplating a metal on a cathodically biased substrate while controlling azimuthal uniformity includes: (a) providing the substrate into an electroplating apparatus configured for rotating the substrate during electroplating, wherein the apparatus comprises a first anode and a multi-segmented auxiliary anode or a multi-segmented auxiliary electrode configured to serve both as an auxiliary anode and an auxiliary cathode; and (b) electroplating the metal on the substrate while rotating the substrate, and while providing power to the segments of the multi-segmented auxiliary anode or the multi-segmented auxiliary electrode in correlation with the rotation of the substrate, such that said anode donates plating current to a first portion of the substrate at a selected azimuthal position of the substrate to a different level than to a second portion of the substrate having the same average arc length and the same average radial position and residing at a different angular azimuthal position, or such that said auxiliary electrode donates current to the first portion and diverts the current from the second portion.

In another aspect a method of electroplating a metal on a substrate while controlling azimuthal uniformity includes: (a) providing the substrate into an electroplating apparatus configured for rotating the substrate during electroplating; and (b) electroplating the metal on the substrate while rotating the substrate relative to a shield such that a selected portion of the substrate at a selected azimuthal position dwells in a shielded area for a different amount of time than a second portion of the substrate having the same average arc length and the same average radial position and residing at a different angular azimuthal position.

For example, the substrate may be rotated at a first speed when the selected portion of the substrate is less shielded, and at a second speed when the selected portion of the substrate is more shielded, wherein one full rotation of the substrate comprises a first period of rotation at the first speed and a second period of rotation at the second speed. In some embodiments, the second speed is lower than the first speed, that is, the substrate slows down when the selected angular position of the wafer (usually the one affected by current crowding) passes through the more shielded area. In a more specific example, the first speed is at least about 20 rpm, the second speed is less than about 10 rpm, and the substrate makes at least about 5 variable-speed full rotations during the course of electroplating.

In some embodiments, different dwell times in the shielded area are achieved by rotating the substrate bidirectionally at a constant speed. The bidirectional rotation is configured such that the selected angular position of the wafer spends more (or less) time in the shielded area in comparison with other angular positions.

Preferably, the distance between the shield and the platable surface of the substrate is no more than about 0.1 of the radius of the substrate. In some embodiments, the distance between the shield and the platable surface of the substrate is no more than about 4 mm.

In some embodiments the electroplating apparatus further comprises an ionically resistive ionically permeable element having a flat surface that is substantially parallel to and separated from the plating face of the substrate by a distance of about 10 millimeters or less during electroplating, wherein the element has a plurality of non-communicating holes. In some embodiments, the shield is an azimuthally asymmetric shield eclipsing some of the holes of the ionically resistive ionically permeable element or the shield itself is the ionically resistive ionically permeable element having an azimuthally asymmetric distribution of hoes.

In one aspect an electroplating apparatus for electroplating a metal on a substrate is provided, where the apparatus includes: a plating chamber configured to contain an electrolyte and a shield; a substrate holder configured to hold the substrate; and a controller comprising program instructions for electroplating the metal on the substrate while rotating the substrate relative to the shield such that a selected portion of the substrate at a selected azimuthal position dwells in a shielded area for a different amount of time than a second portion of the substrate having the same average arc length and the same average radial position and residing at a different angular azimuthal position. In another aspect, a system comprising such apparatus and a stepper is provided.

In another aspect, a non-transitory computer machine-readable medium comprising program instructions for control of an electroplating apparatus, is provided, where the program instructions include code for electroplating metal on a substrate while rotating the substrate relative to a shield such that a selected portion of the substrate at a selected azimuthal position dwells in a shielded area for a different amount of time than a second portion of the substrate having the same average arc length and the same average radial position and residing at a different angular azimuthal position.

In another aspect a method of electroplating a metal on a substrate while controlling azimuthal uniformity is provided, where the method includes: providing the substrate into an electroplating apparatus configured for rotating the substrate during electroplating, wherein the electroplating apparatus comprises a multi-segmented auxiliary electrode configured to divert and/or donate current during electroplating; and (b) electroplating the metal on the substrate while rotating the substrate relative to the stationary multi-segmented auxiliary electrode such that a selected portion of the substrate at a selected azimuthal position dwells in an area proximate to a segment of the auxiliary electrode for a different amount of time than a second portion of the substrate having the same average arc length and the same radial position and residing at a different angular azimuthal position, and wherein at least one segment of the auxiliary electrode diverts and/or donates plating current differently than another segment. For example, one of the segments may be accept a current at a different level than other segments (anodic or cathodic), or one of the segments may have the opposite polarity from the other segments.

In another aspect, a method of electroplating a metal on a substrate while controlling azimuthal uniformity includes: providing the substrate into an electroplating apparatus configured for rotating the substrate during electroplating, wherein the electroplating apparatus comprises an azimuthally asymmetric auxiliary electrode configured to divert and/or donate current during electroplating; and electroplating the metal on the substrate while rotating the substrate relative to the azimuthally asymmetric auxiliary electrode such that a selected portion of the substrate at a selected azimuthal position dwells in an area proximate to the azimuthally asymmetric auxiliary electrode for a different amount of time than a second portion of the substrate having the same average arc length and the same average radial position and residing at a different angular azimuthal position.

In another embodiment a method of electroplating a metal on a substrate while controlling azimuthal uniformity includes: (a) providing the substrate into an electroplating apparatus configured for rotating the substrate during electroplating, wherein the electroplating apparatus comprises a rotatable multi-segmented thief cathode configured to divert current during electroplating; and (b) electroplating the metal on the substrate while rotating the substrate and the thief cathode at the same speed such that a selected portion of the substrate at a selected azimuthal position dwells in an area proximate to a segment of the thief cathode for a different amount of time than a second portion of the substrate having the same average arc length and the same average radial position and residing at a different angular azimuthal position.

In another embodiment, a method of electroplating a metal on a substrate while controlling azimuthal uniformity includes (a) providing the substrate into an electroplating apparatus configured for rotating the substrate during electroplating, wherein the electroplating apparatus comprises a rotatable azimuthally asymmetric thief cathode configured to divert current during electroplating; and (b) electroplating the metal on the substrate while rotating the substrate and the thief cathode at the same speed such that a selected portion of the substrate at a selected azimuthal position dwells in an area proximate to the thief cathode for a different amount of time than a second portion of the substrate having the same average arc length and the same average radial position and residing at a different angular azimuthal position.

In another embodiment, a method of electroplating a metal on a substrate while controlling azimuthal uniformity includes providing the substrate into an electroplating apparatus configured for rotating the substrate during electroplating, wherein the electroplating apparatus comprises a rotatable multi-segmented auxiliary anode configured to divert current during electroplating or a rotatable multi-segmented auxiliary electrode configured to function both as an anode and a cathode; and electroplating the metal on the substrate while rotating the substrate and the multi-segmented auxiliary anode or the multi-segmented auxiliary electrode at the same speed such that a selected portion of the substrate at a selected azimuthal position dwells in an area proximate to a segment of the anode or the electrode for a different amount of time than a second portion of the substrate having the same average arc length and the same average radial position and residing at a different angular azimuthal positions.

In another embodiment a method of electroplating a metal on a substrate while controlling azimuthal uniformity includes: (a) providing the substrate into an electroplating apparatus configured for rotating the substrate during electroplating, wherein the electroplating apparatus comprises a rotatable azimuthally asymmetric anode configured to divert current during electroplating or a rotatable azimuthally asymmetric anode/cathode configured to both divert and donate current during electroplating; and (b) electroplating the metal on the substrate while rotating the substrate and the anode or anode/cathode at the same speed such that a selected portion of the substrate at a selected azimuthal position dwells in an area proximate to the anode or the anode/cathode for a different amount of time than a second portion of the substrate having the same average arc length and the same average radial position and residing at a different angular azimuthal position.

In some embodiments, all methods presented herein may further include rotating a shield having a generally annular body with a removed segment, which resides in close proximity of the wafer, during the course of electroplating. This can optimize the flow of electrolyte in the proximity of the wafer as the electrolyte will tend to move laterally at the wafer surface in the direction of the opening of that shield. In some embodiments this flow diverter is rotated at a speed that is different from the wafer rotation speed, thereby maximizing randomization of the flow patterns.

For all methods disclosed herein, the selected portion of the substrate may include an area adjacent to a wafer notch, a wafer flat or a set of azimuthally missing features, which is registered (e.g., by an optical aligner) prior to electroplating. Electroplating, in some embodiments includes filling recessed features during TSV or WLP processing.

These and other features and advantages of the present invention will be described in more detail below with reference to the associated drawings.

BRIEF DESCRIPTION OF THE DRAWINGS

FIGS. 5A-5F illustrate shields in accordance with embodiments presented herein.

DETAILED DESCRIPTION

Figure 1A:
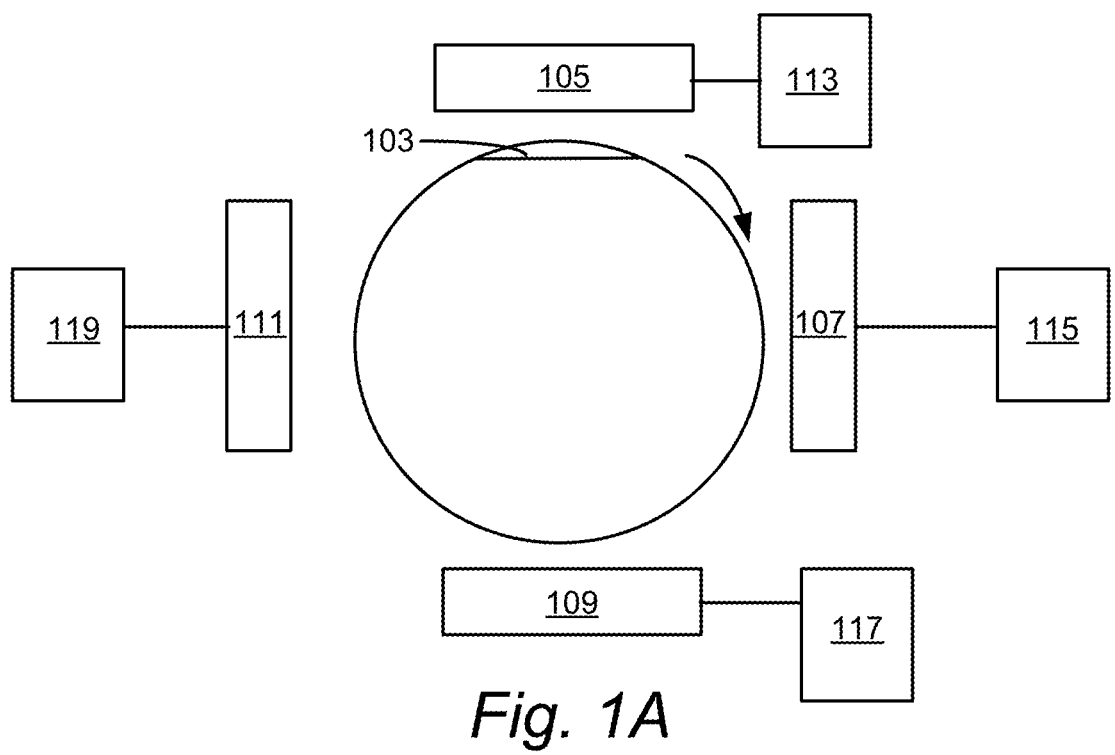
FIGS. 1A-1B show schematic top views of an asymmetrical wafer rotating in the presence of a multi-segmented thief cathode, energized in correlation with the wafer rotation.

Methods and apparatus for electroplating a metal on a substrate while controlling uniformity of the electroplated layer, such as azimuthal uniformity, radial uniformity, or both, are provided.

Embodiments are described generally where the substrate is a semiconductor wafer; however the invention is not so limited. Provided apparatus and methods are useful for electroplating metals in TSV and WLP applications, but can also be used in a variety of other electroplating processes, including deposition of copper in damascene features. Examples of metals that can be electroplated using provided methods include, without limitation, copper, tin, a tin-lead composition, a tin-silver composition, nickel, cobalt, nickel and/or cobalt alloys with each other and with tungsten, a tin-copper composition, a tin-silver-copper composition, gold, palladium, and various alloys which include these metals and compositions.

In a typical electroplating process, the semiconductor wafer substrate, which may have one or more recessed features on its surface is placed into the wafer holder, and its platable surface is immersed into an electrolyte contained in the electroplating bath. The wafer substrate is biased negatively, such that it serves as a cathode during electroplating. The ions of the platable metal (such as ions of metals listed above) which are contained in the electrolyte are being reduced at the surface of the negatively biased substrate during electroplating, thereby forming a layer of plated metal. The wafer, which is typically rotated during electroplating, experiences an electric field (ionic current field of the electrolyte) that may be non-uniform for a variety of reasons, including azimuthal asymmetry existing in the wafer substrate. This may lead to non-uniform deposition of metal.

The electroplating apparatus provided herein typically includes a substrate holder configured for holding and rotating the substrate during electroplating; a plating bath configured for holding an electrolyte and an anode; and a power supply having a negative terminal electrically connected to the wafer substrate, and a positive terminal electrically connected to the anode. The apparatus further includes one or more elements, such as shields, and auxiliary electrodes (cathodes, anodes or anode/cathodes), that are configured for tailoring uniformity profile during plating. The apparatus, in some embodiments, further includes a controller having program instructions for performing methods disclosed herein, such as for varying rotational speed and/or rotational direction of the substrate in a manner that allows controlling plating uniformity. The controller, in some embodiments, further includes program instructions for energizing auxiliary electrodes in correlation with the wafer rotation.

The present disclosure relates to method and apparatus for controlling plating uniformity particularly, not only radial non-uniformity but also azimuthal non-uniformity. Azimuthal non-uniformity can arise in a number of ways. In one example, semiconductor wafers are sometimes cut along a chord (e.g. JEDA wafers) and have a notch, e.g. for registration purposes during process manipulations. These chords or notches constitute azimuthal non-uniformities in the wafer. As the wafer is rotated and exposed to a plating field, the edges of the wafer along the chord or notch are exposed to different field strength than other corresponding areas of the wafer along the same annulus (i.e., same radial position). During plating, there will be azimuthal non-uniformity from the edge of the chord or notch going inward toward the center areas of the wafer. As another example, a seed layer is typically deposited on a wafer that has been patterned with device features, or device features are patterned in a layer of photoresist overlying the seed layer on a wafer that is substantially round (with the exception of a notch for angular registry). These device features are typically repeated as a series of, for example, rectangular dies. Since the wafer itself is round, inevitably there are areas at the edge of the wafer where there is insufficient room for a complete die with all the die device features or patterns (or where the topography is significantly different than that of the features as a whole). Because of this, there are inevitably boundaries between the areas where there are no features (for example unexposed unpatterned resist) and the areas with features. Therefore along a given annulus within the perimeter of the wafer, typically but not necessarily toward the perimeter of the wafer, there are feature pattern variations, such as regions containing featured and other non-featured surfaces. Because there are boundaries between featured and non-featured (or topographically different) areas, there are necessarily azimuthal plating variations due to the fact that the line of current flow and the electric field is tailored to plate, for example, on a particular topography a certain way and/or because, at these boundaries, there is a different topography and an excess exposure to the plating cell's field and lines of current, so plating current crowded or built up at these transition locations. One way to overcome the topography change would be to print partial (non-functional) features and dies to fill the areas where dies would not normally fit, extending the pattern to the wafer edge, for example, all the way around the periphery of the wafer. However, since dies are commonly lithographed individually on the wafer, there is an associated prohibitive cost to forming these "dummy" features. These substrates will be referred to as azimuthally asymmetric substrates. Notably, such substrates may be geometrically asymmetric (e.g., have a notch or a cut-out portion and the substrate itself is not substantially round), or the asymmetry may be lie in the distribution of the features defined on the substrate (e.g., a missing set of features or die), or both. In an azimuthally asymmetric substrate, there is azimuthal variation of substrate geometry or substrate topography at least at one radial position.

Azimuthal plating non-uniformity on substrates, particularly on azimuthally asymmetric substrates is addressed, in some embodiments, by using azimuthally asymmetric shields and azimuthally asymmetric auxiliary electrodes and/or by using rotational techniques that align selected azimuthal positions of the substrates with shielded areas or areas in the proximity of thief cathodes.

Azimuthally asymmetric shields are shields that shield the substrate from plating current at some azimuthal positions, and not to the same extent or not at all in other azimuthal positions, along at least one radial position. These include wedge-shaped shields, batwing-shaped shields, etc. A purely annular shield (without protrusions to the center of the annulus) is not azimuthally asymmetric with respect to a round workpiece such as a wafer. Shields are typically made of an ionically resistive material relative to the main plating solution media, and are placed in the proximity of the wafer substrate to prevent unwanted excessive current crowding at selected positions of the substrate. In some cases the ionic resistance of the shield is not absolute, but is only significantly greater than the plating media itself. In other cases the shield has not only an azimuthally variable shape, but also has an azimuthally and/or radially variable ionic resistance, for example, created by having a variable pattern of holes in a resistive plate such as a piece of plastic or ceramic. Generally the shields are electrically non-conductive (they do not conduct electrical current by transport of electronics), and are therefore made of dielectric material such as plastics, glasses, and ceramics, and not made of metals. The shields are most effective at tailoring azimuthal plating uniformity if the distance between the platable surface of the wafer and the closest surface of the shield is no more than about 0.1 times the radius of the substrate, such as no more than about 0.2 of the radius of the substrate. As a specific example, the azimuthal edge correcting shield according to this invention for a 300 mm diameter wafer would be closer than about 30 mm, more typically spaced less than 15 mm from the wafer substrate, for example, about 7 mm from the wafer surface. In many embodiments, the shields are disposed in the plating bath, immersed in the electrolyte, very close to the substrate, such as within 4 mm of the platable surface of the substrate.

Azimuthally asymmetric thief cathodes are azimuthally asymmetric negatively biased members (e.g., strips of metal), which are disposed in ionic communication with the plating electrolyte (e.g., either directly in the plating bath, or in an adjacent chamber in ionic communication with the wafer and wafer edge), where the thieves are configured for diverting a portion of ionic plating current emanating from the main anode placed generally below and aligned with the wafer away from the substrate to the thief cathode. Alternatively, the electrode may operate as an auxiliary anode, configured and operating for delivering additional ionic plating current, in excess of what would be supplied from the main anode. In some embodiments the electrode can cycle its operation between both of these two modes, acting as an auxiliary anode, and later as an auxiliary cathode, both synchronized with the rotation of the wafer, such that the electrode is energized at a first level and/or polarity when selected angular position of the rotating substrate passes through its proximity, and is energized at a different level and/or with different polarity when a different angular position of the rotating wafer passes through its proximity. Thus, during one full rotation of the wafer the azimuthally asymmetric electrode has at least two states (energized by applying two levels of current, energized/non-energized, or energized at different polarities). Anodes/cathodes can be energized by a bipolar power supply which allows for switching from cathode to anode mode without change in hardware. Auxiliary electrodes are typically biased and controlled separately from the substrate, e.g., using a separate power supply or resistive controlling circuitry, or a separate channel on the same power supply that provides current to the substrate. Azimuthally asymmetric electrodes such as thief cathodes, auxiliary anodes, and anode/cathodes modify plating current at some azimuthal positions of the wafer to a different extent than at other azimuthal positions around at least one radial position. An example of an azimuthally asymmetric thief, anode, or an anode/cathode is a C-shaped auxiliary electrode that surrounds the wafer periphery out beyond the radius of the wafer over only a portion of the wafer circumference (e.g., an annular thief having a segment removed). In some embodiments, the body of the C-shaped electrode has an arc length of less than about 120 degrees such as less than about 90 degrees. An annular electrode, in contrast, is azimuthally symmetric and surrounds the wafer entirely over the entire portion of the circumference. In some embodiments the azimuthally asymmetric electrodes reside in close proximity to the wafer, e.g., preferably within a distance not greater than 0.2 times the radius of the wafer. In some embodiments, the azimuthally asymmetric electrodes reside in a confinement structure that provides a current exposure (e.g., through a slot or series of openings in the confinement structure) approximating a C-shaped electrode. In this case the electrode itself may have a variety of shapes, as its function will be determined by the shape of the confinement structure, which essentially forms a virtual electrode. The position of the auxiliary electrode, in some embodiments, may include any position about the periphery of the wafer, such as those disclosed in the U.S. Patent Application Pub. No. 2010/0116672, titled "Method and Apparatus for Electroplating" by Mayer et al. published May 13, 2010, which is herein incorporated by reference in its entirety. The containment structure for the auxiliary electrode, when used, may include a plurality of through-holes allowing for communication of the electrode with the plating cell, such as those described in the Provisional U.S. Application No. 61/499,653, titled "Purging Micro-Containments During Electroplating" filed Jul. 1, 2011 by Feng et al.

Methods and apparatus for aligning and varying the amount of current and the sign of the current in time and space between the azimuthally asymmetric electrodes and the selected azimuthal positions on the wafer substrate, and for adjusting dwell times of selected azimuthal positions of the wafer in the proximity of thief cathodes, are provided.

In the embodiments presented herein, it is important that the position of the selected azimuthal region on the substrate (i.e., that region targeted for special treatment) be known prior to electroplating. Therefore, in the embodiments presented herein a selected azimuthal position is registered prior to electroplating, e.g., with an optical aligner. For example, a position of the notch on the wafer (selected azimuthal position) can be measured by a notch aligner. Some position and notch aligners use an optical measuring device, comprising a photodiode array, which is capable of acquiring a shadow image of the substrate and store it in a memory file, e.g., in a digital linear file. The registration of the notch position is determined, and with this knowledge, by computation relative to the notch, of the selected azimuthal region for special treatment, allows controlling the orientation of this azimuthal position throughout the plating process, and synchronization of shields and/or auxiliary electrodes (position and/or power applied) with a specific azimuthal region on the wafer, as desired. In a typical electroplating process provided herein, the position of a selected azimuthal portion of the substrate is known with respect to the indexing notch position prior to electroplating and during electroplating, allowing for orchestration of azimuthal current correction throughout the plating process. As a specific example, the wafers may be notch aligned inside the Front Opening Unified Pod (FOUP) prior to being placed onto the plating tool. In another example, the wafers pass through a notch aligning device just prior to undergoing plating. In a third example, the notch alignment is done on a plating tool as a initial step in the sequence of subsequent plating and/or non-plating operations (e.g. rinsing and chemical pretreatment, vacuum pretreating, surface pretreating, copper plating, nickel plating, lead-free solder plating, gold plating) wherein the change in the orientation of the wafer can be tracked as long as the operation in each chamber does not lead to a loss of registry (such as slipping in a wafer holding chuck).

In some embodiments, the methods and apparatus provided herein address corrections for both radial and azimuthal non-uniformity.

In some embodiments, radial plating uniformity control can be achieved through use of an ionically resistive ionically permeable element, positioned between the working electrode (the wafer substrate) and the counter electrode (the anode) during plating, in order to shape the electric field and control electrolyte flow characteristics. For example, an ionically resistive element having electrolyte-permeable 1-D (i.e., non-communicating) through-holes, where the element resides in close proximity of the wafer substrate has been found to be highly effective in this regard. One example of such an ionically resistive element is described in U.S. non-provisional application Ser. No. 12/291,356, entitled, "Method and Apparatus for Electroplating," by Jonathan Reid et al., filed on Nov. 7, 2008, which is incorporated by reference herein for all purposes. The ionically resistive ionically permeable element described therein substantially improves radial plating uniformity on thin resistive seed layers. It is particularly useful when employed in combination with a second (thief) cathode or anode configured to divert or supply a portion of current from near-edge region of the wafer. It is also compatible with potential-controlled wafer entry, which is, in some embodiments, a preferred wafer entry process. The ionically resistive ionically permeable element serves for achieving a nearly constant and uniform current source in the proximity of the wafer (cathode) and has been referred to as a virtual anode. In contrast, an anode in the same close-proximity to the substrate would be significantly less apt to supply a nearly constant current to the wafer, but rather, would support a constant potential at the anode metal surface, thereby allowing the current to be greatest where the net resistance from the anode plane to the terminus (e.g. to peripheral contact points on the wafer) is smaller. So while the ionically resistive ionically permeable element has been referred to as a high-resistance virtual anode (HRVA), this does not imply that electrochemically the two are interchangeable. While the HRVA is certainly viewable as a "virtual current source", i.e. it is a plane from which the current is emanating, and therefore can be considered a "virtual anode" because it is a source of anodic current flow, it is the relatively high-ionic-resistance of the element (with respect to the electrolyte) that leads to further advantageous, generally superior wafer uniformity when compared to having a metallic anode located at the same physical location. And of particular relevance to this disclosure is a preferred embodiment construct wherein a variable spacing, size and density of the 1-D HRVA holes in either the radial and/or the azimuthal array of holes creates a highly controllable, non-uniform source of current at the periphery. This, combined with the registration of the wafer angular position (notch) and the dwell/rotation rate with angular position, operates to correct for azimuthal non-uniformities in an analogous manner to having a shield blocking the source of current from an anode below the wafer.

Two features of the HRVA are of particular importance: the placement of HRVA in close proximity with respect to the wafer, and the fact that through-holes in the HRVA are spatially and ionically isolated from each other and do not form interconnecting channels within the body of HRVA. Such through-holes will be referred to as 1-D through-holes because they extend in one dimension, often, but not necessarily, normal to the plated surface of the wafer (in some embodiment the 1-D holes are at an angle with respect to the wafer which is generally parallel to the HRVA front surface). These through-holes are distinct from 3-D porous networks, where the channels extend in three dimensions and form interconnecting pore structures. An example of a HRVA is a disc made of an ionically resistive material, such as polyethylene, polypropylene, polyvinylidene difluoride (PVDF), polytetrafluoroethylene, polysulphone, polyvinyl chloride (PVC), polycarbonate, and the like, having between about 6,000-12,000 1-D through-holes. The disc, in many embodiments, is substantially coextensive with the wafer (e.g., has a diameter of about 300 mm when used with a 300 mm wafer) and resides in close proximity of the wafer, e.g., just below the wafer in a wafer-facing-down electroplating apparatus. Preferably, the plated surface of the wafer resides within about 10 mm, more preferably within about 5 mm of the closest HRVA surface.

The presence of a resistive but ionically permeable element close to the wafer substantially reduces the terminal effect and improves radial plating uniformity. It also simultaneously provides the ability to have a substantially spatially-uniform impinging flow of electrolyte directed upwards at the wafer surface by acting as a flow diffusing manifold plate. Importantly, if the same element is placed farther from the wafer, the uniformity of ionic current and flow improvements become significantly less pronounced or non-existent. Further, because 1-D through-holes do not allow for lateral movement of ionic current or fluid motion within the HRVA, the center-to-edge current and flow movements are blocked within the HRVA, leading to further improvement in radial plating uniformity.

Another important feature of the HRVA structure is the diameter or principal dimension of the through-holes and its relation to the distance between the HRVA and the substrate. Preferably the diameter of each through-hole (or of majority of through-holes), should be no more than the distance from the plated wafer surface to the closest surface of the HRVA. Thus, the diameter or principal dimension of the through holes should not exceed 5 mm, when HRVA is placed within about 5 mm of the plated wafer surface.

Thus use of a HRVA as described above can address radial non-uniformity. In order to address azimuthal non-uniformity additional features and methods are needed. Embodiments described herein include one or more components of the plating apparatus that compensate for the azimuthal asymmetry on the wafer surface during plating. More specifically, the one or more components of the plating apparatus shape the electric field in such a way so as to compensate for the azimuthal asymmetry on the wafer surface and thus provide highly uniform azimuthal plating in addition to highly uniform radial plating. "Azimuthal asymmetry" may refer to azimuthal non-uniformity in topography, the resultant plating current non-uniformity that results, the resultant field variations created by such local topography, or combinations thereof.

It is noted that in some embodiments, the HRVA plate can be used primarily or exclusively as an electrolyte flow shaping element, regardless of whether it tailors radial deposition uniformity or not. Thus, for example, in TSV and WLP electroplating, where metal is being deposited at very high rates, uniform distribution of electrolyte flow is very important, while radial non-uniformity control may be less necessary. Therefore the HRVA plate can be referred to as both ionically resistive ionically permeable element, and as a flow shaping element, and can serve from a deposition-rate corrective prospective in either altering the flow of ionic current, in altering the convective flow of material, or both.

Embodiments described herein address azimuthal non-uniformity using components of the plating apparatus that shape the field in such a way as to compensate for azimuthal topographical variation on the wafer during plating. More specifically, the wafer and these field shaping components are moved, in some embodiments, relative to one another in such a way that the localized field or fields produced by the components are proximate to the azimuthally asymmetric topographical features for which they are intended to compensate and thus uniform azimuthal plating is achieved. In embodiments described herein, control of the wafer rotation and/or shield rotation and/or the HRVA rotation and/or auxiliary electrode rotation can be accurately synchronized using one or more rotational digital encoders. Additionally, the localized shaped fields produced by components described herein need not always be proximate the areas of the wafer with azimuthally asymmetric topography, that is, the localized fields may only spend a disproportionate amount of time (referred to as "dwell") proximate these areas relative to other portions of the wafer so that azimuthally uniform plating is achieved. This may be termed "azimuthal averaging."

Since the methods described herein in some embodiments, involve one or more of the wafer and/or shields rotating relative to one another, the methods are sometimes referred to as "rotationally variable shielding" (RVS), and the apparatus as containing rotationally variable shields (RVS's). The azimuthally asymmetric shields used herein may include any of the azimuthally asymmetric shields described in the U.S. Pat. No. 6,919,010 issued on Jul. 19, 2005 to Mayer et al., and titled "Uniform electroplating of thin metal seeded wafers using rotationally asymmetric variable anode correction", in the U.S. Pat. No. 7,682,498 issued on Mar. 23, 2010 to Mayer et al., titled "Rotationally asymmetric variable electrode correction" and in U.S. Pat. No. 6,027,631 issued on Feb. 22, 2000 to Broadbent et al., and titled "Electroplating system with shields for varying thickness profile of deposited layer", which are all herein incorporated by reference.

Below is a short description of some operative characteristics of RVSs. Generally, as in the description herein, the RVS shield is a dielectric element that is located close to the wafer that serves to block lines of current from reaching the wafer from an anode position "below" (in the case where the anode is below the wafer) for a period of time when a particular portion of the wafer lies "above" the RVS shield. To be most highly effective, the RVS element should be positioned relatively close to the wafer so that current cannot circumvent the shield, flowing around the RVS element edges and into the bulk of the shielded area. The imprint or influence of the RVS is therefore limited by the "proximity focusing" of the element. To avoid significant smearing of the elements effects, the element's arc length (about an azimuth) at a particular distance from the center of rotation therefore should be several times (e.g. >3 times) the distance between the RVS shield and the wafer surface. For example, if the distance between the wafer and the RVS shield is 4 mm, the RVS shield would need to be about 12 mm in arc length to be highly effective. In designing a shield, in particular, for designing uniformity corrections at near the wafer center, these characteristic ratios may no longer need be used, and so modifications in the shape of the RVS as would be predicted by a "blocking model" may be required to compensate for the ability of current to travel around the RVS and significantly into the area behind the shield.

In some embodiments, the RVS shield is incorporated into the design of a HRVA plate. A "HRVA," as used herein, is for convenience, because when used in this particular set of operations, the porous plate does not necessarily have to exhibit a relatively high resistance to the total cell electrolytic solution resistance to be functional as a rotationally variable shielding element. As mentioned above, it can also be referred as a flow shaping element. The HRVA plate can serve many purposes, for example, including but not limited to modifying the current distribution on the wafer, creating shearing flow between the rotation wafer and the plate, creating a high impinging flow up at the wafer surface, and flow turbulence. In some embodiments the HRVA plate is created by drilling a large number of holes (e.g. 6000 holes 0.5 mm in diameter over an approximately 300 mm diameter area) into a solid piece of dielectric material (e.g. a 0.5 inches thick piece of plastic such as polypropylene). With regards to the embodiments described herein, the RVS shield is then created by not drilling holes in the plate in a spatially regular pattern, but rather only into select areas and not into other area, in order to create the various current blocking patterns described herein as required by the RVS (as well as other techniques for selectively blocking predrilled holes are described below). In some embodiments, a select HRVA constructed with a particular holes pattern is used to create the shield pattern. In other embodiments only the RVS pattern is created in this manner, and peripheral extra holes in the HRVA can be blocked by placing shields of various sizes, angles, etc., allowing for modification of the shield performance as may be needed from time to time or from wafer-pattern to wafer-pattern. The HRVA having azimuthally asymmetric hole-free regions assumes a function of an azimuthally asymmetric shield.

For the purposes of simplicity, the following description assumes that there is a single feature or region of the wafer that has azimuthal asymmetry, for example, a sector of a wafer has die and non-die areas, or for example, a wafer where a chord or notch is cut from the wafer. Embodiments described herein also include methods and apparatus to achieve high azimuthal plating uniformity where there is azimuthal topographical variation, for example, in more than one area on the wafer, for example, where multiple dies are lithographed over most of the wafer's surface, and where there are non-die outlying areas near and around the entire perimeter of the wafer surface. In such instances, components are configured and/or methods performed, to compensate for such azimuthal asymmetry, as will be apparent to one of ordinary skill in the art in light of this description.

Unidirectional Wafer Rotation

In one embodiment, the wafer is rotated in a single direction, for example clockwise about an axis perpendicular to the surface of the wafer, and the components configured to produce a localized field proximate to the azimuthally asymmetric topographical features are varied in synchronization with respect to the rotating wafer in order to compensate for the azimuthal asymmetry and provide uniform azimuthal plating. Examples of this embodiment are described below. It is noted that these described embodiments are illustrated as used in conjunction with a unidirectionally rotated wafer, but, more generally, can be also used where the wafer rotates bidirectionally (both clockwise and counterclockwise) during electroplating and where the wafer rotates at constant or variable speed (including both unidirectionally and bidirectionally).

Segmented Auxiliary Electrode

In some embodiments, a second electrode, a (thief) cathode or source (anode) or an anode/cathode, includes several segments, where each of the segments can be separately powered by a separate power supply or using one power supply having multiple switches or channels adapted to independently power segments of the second cathode. Specifically, in one example, segments of a second cathode are used for providing plating current corrections at different azimuthal positions of the wafer as the wafer rotates. The current applied to any individual secondary electrode segment at any point in time may be positive, negative, or zero, with the sign and amount of current varying in time correlated and synchronized with the wafer angular position at that time. As it has been previously mentioned, any of the current, voltage, or a combination of these may be controlled, in order to correlate power provided to electrode (or a segment) with the rotation of the wafer.

In this multi-segmented electrode embodiment, the wafer substrate is first registered such that a position of a selected azimuthal portion on the wafer is known, is secured in the substrate holder in the electroplating apparatus such that its platable surface is immersed into electrolyte, and is rotated in the electroplating apparatus having a stationary multi-segmented thief cathode or anode source or an anode/cathode, which is configured to divert or supply additional current from or to the wafer edge in the limited area of the wafer periphery associated with the location and azimuthal extent of the particular electrode. The individual segments of the thief cathode or secondary anode source are disposed about different azimuthal positions, and can be powered separately, such that different levels of current can be applied to different segments of the thief cathode. The power applied to the segments is synchronized with the rotation of the substrate in such a manner that a selected portion of the substrate at a selected azimuthal position will experience a different amount of plating current diverted by a thief (or donated by an auxiliary anode), than an analogous portion (i.e. a portion of the average same arc length and same average radial position) of the substrate at a different azimuthal position. For example, a higher (or lower) level of thieving current may be applied to those segments of the thief cathode, which are located proximate the selected azimuthal position.

Figure 1B:
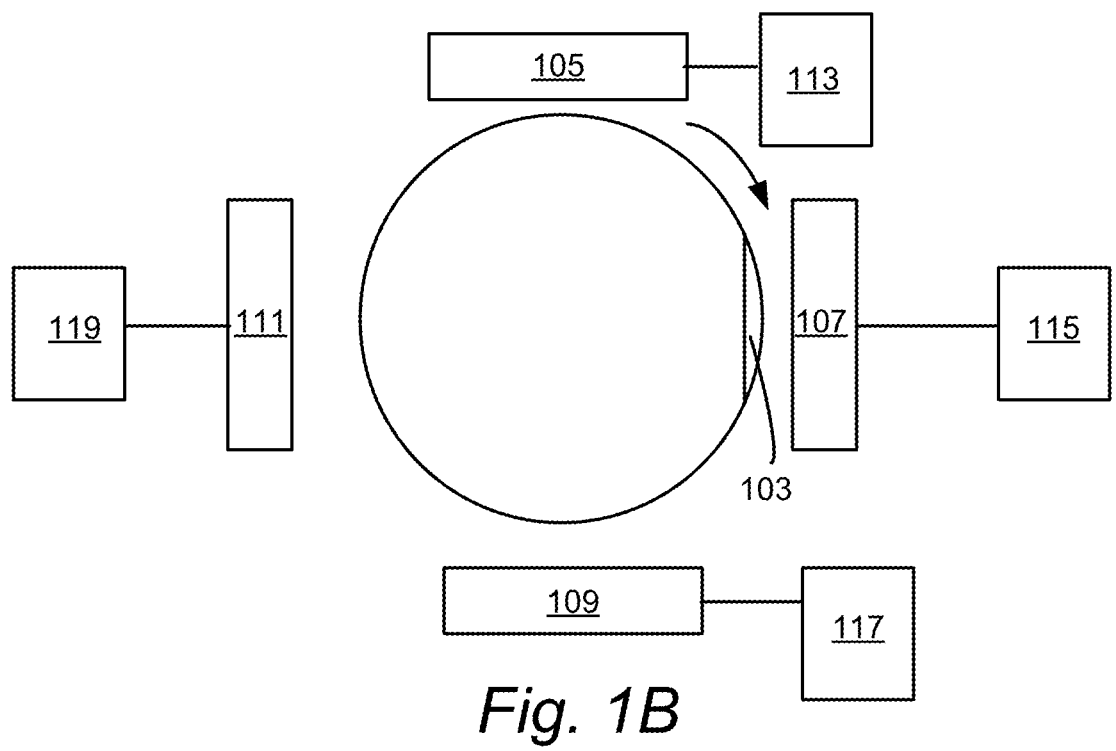

This concept is illustrated in FIGS. 1A and 1B which show a schematic view of a wafer 101 having a missing die region 103 (selected azimuthal position). Peripheral to the wafer are located four thief cathode segments, 105, 107, 109, and 111, each electrically connected to its own power supply 113, 115, 117, and 119. One of ordinary skill in the art would appreciate that one power supply with a plurality of channels can also be used. For example, a single power supply with a combination of switches and/or current modulators could be used. In those embodiments, where an anode/cathode is used, the segments are connected to bipolar power supplies. The thief electrode segments are located at different azimuthal positions with respect to the wafer. The segment 105 is aligned with the missing die region and resides at 0° azimuth. Segments 107, 109, and 111 reside at 90°, 180°, and 270° azimuthal positions respectively. As the wafer 101 rotates in the clockwise direction, the missing feature region 103 becomes aligned consecutively with the segment 107, then with segment 109, with segment 111, and then again with segment 105. FIG. 1B shows the same system as shown in FIG. 1A, with the wafer rotated by 90° such that the wafer flat 103 is aligned with the thief segment 107.

Because current density at the missing die region will be different than the current density at other regions of the wafer, a different amount of current needs to be diverted from the missing die part as compared with the other parts. Accordingly, in one embodiment, the thief cathode segments are powered in concert with wafer rotation, such that a first level of current is supplied to the segments aligned with the missing die region, while a second level of current is supplied to the thief segments aligned with the other portions of the wafer.

For example, in a position shown in FIG. 1A, a first level of current, X, is supplied to the segment 105 aligned with the wafer flat 103, while a second (different) level of current, Y, is supplied to each of the segments 107, 109, and 111. As the wafer rotates 90° to a position shown in FIG. 1B, the first level of current, X, will be supplied to the segment 107, now aligned with wafer flat 103, while the second level of current Y, is supplied to the segments 109, 111, and 105. By alternating the current supplied to the auxiliary electrodes segments in accordance with wafer rotation, a correction for plating non-uniformity at circular and the chord region of the wafer is properly made. A controller connected to the power supplies and containing program instructions for correlating the power levels supplied to thief segments with wafer rotation speed, can be used to orchestrate the process.

As it has been mentioned, this embodiment is not limited to the use of a multi-segmented thief cathode, but may also be used with a multi-segmented anode, or a multi-segmented anode/cathode. In a particularly preferred embodiment, the current of each element may be of an optimally determined waveform having a sequence of alternating current levels or signs during the period of wafer rotation. For example, by having a plating cell designed with an edge shield and/or HRVA that would create a generally thin deposit in regions of the wafer which are not missing die or features, and designed to give a generally thick set of features in the missing die/feature region, current adding and removing "pulses" to the wafer can be applied to the wafer as it rotates. Then the sign of each of the segments of the multi-segmented-electrode will change from anodic (supplying peripheral anodic current) when the thin majority edge is proximate, and cathodic (removing peripheral anodic current) when the minority thick region (missing die/feature region) is aligned and proximate.

It is understood that the presentation shown in FIGS. 1A and 1B is schematic only. The auxiliary electrode segments are generally located outside and around, or just under the wafer periphery, and when outside and around the wafer, can be located below, at the same level, or above the wafer plane, either in the same plating chamber as the wafer or in a different plating chamber in ionic communication with the main plating chamber. Any appropriate arrangement of the segments can be used, as long as the segments are aligned with different azimuthal positions about the wafer. The number of segments can vary depending on the needs of the process. In some embodiments between about 2-10 segments are used.

While the multi-segmented thief cathode is particularly useful with a HRVA disposed in close proximity of the wafer, this is a separate embodiment which can be used both independently and in combination with various plating apparatus features disclosed herein. In other embodiments, which will later be illustrated with reference to FIGS. 10A-10C, a second electrode (thief cathode or source anode or anode/cathode), is azimuthally asymmetric and has a unitary body. For example an electrode having a unitary body with a segment removed, for example an annulus with a segment removed (also referred to as a C-shaped electrode), could be powered synchronously with the wafer. In another embodiment, an azimuthally asymmetric electrode (cathode or anode) is moved with the wafer at the same speed, synchronously with the wafer, so that the appropriate localized field configured to compensate for the azimuthal non-uniformity remains registered with the area of the wafer for which it was designed to field compensate. Such auxiliary electrode may be segmented so that more than one area has azimuthal plating correction, for example, where the segments are arranged appropriately on a support which rotates in sync with the wafer during plating. Such apparatus and methods are within the scope of the invention; however they may be more complex, for example, having more moving parts than are necessary to accomplish the same end. This embodiment includes registering the position of a selected azimuthal position prior to electroplating, providing the wafer substrate to the electroplating apparatus having an azimuthally asymmetric (e.g., C-shaped) or multi-segmented electrode (cathode, and/or anode) (having segments disposed at different azimuthal positions) and rotating both the substrate and the auxiliary electrode, such that the selected portion of the substrate at a selected azimuthal position dwells in the proximity of the azimuthally asymmetric electrode or in the proximity of a segment of the multi-segmented electrode for a different amount of time than an analogous portion at a different azimuthal position. In some embodiments, both the auxiliary electrode (azimuthally asymmetric or multi-segmented) are rotated at the same speed as the wafer substrate such that selected azimuthal position of the wafer is aligned with the asymmetric electrode or a segment of the electrode, such that it is closer (or farther away) to that electrode or the segment than an analogous portion of a substrate at a different azimuthal (angular) position. In another embodiment, a single "C" shaped electrode is fixed and only the wafer rotates, with the applied current to the "C" shaped electrode varying during the wafer rotation cycle, for example from anodic to cathodic currents, or to different levels of anodic, or different levels of cathodic current. When the electrode is located closer to the selected portion of the substrate a greater amount of plating current is diverted towards the thief (or donated by the anode), and this can mitigate current crowding, and unnecessarily thick plating, in selected areas.

Rotating HRVA Having Non-Uniform Distribution of 1D Through-Holes

In another embodiment, the plating uniformity on azimuthally asymmetrical wafers can be adjusted by using a rotating asymmetrical HRVA. The asymmetrical HRVA can have a portion that has a different hole distribution pattern from the main portion, or a portion that is cut off, or a portion without holes altogether. The rotating HRVA is aligned with the rotating wafer such that a distinct portion of the wafer is aligned with a distinct portion of the HRVA. For example, a wafer having a wafer flat region or missing die can be rotated at the same speed as the rotating HRVA such that a region of HRVA having a non-uniform hole distribution (e.g., lower density of holes) is aligned with the wafer flat region during rotation.

Figure 2A:
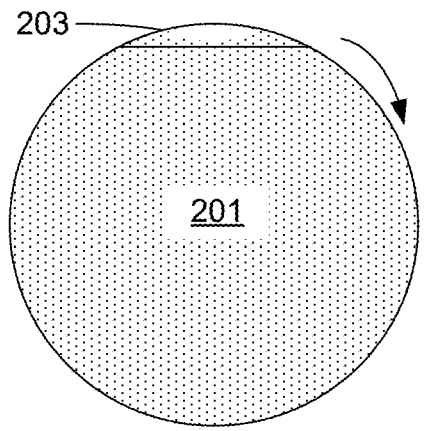
FIGS. 2A-2B show top views of an asymmetrical plate having different distribution of non-communicating holes functioning as an azimuthally asymmetric shield.
Figure 2B:
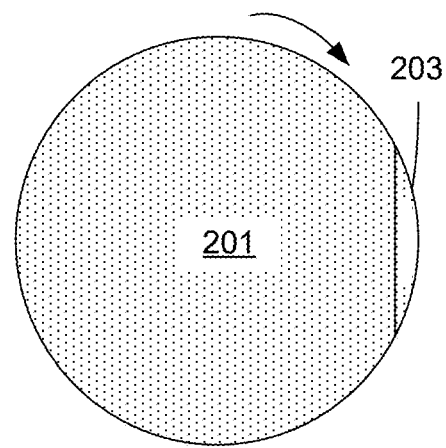

FIGS. 2A and 2B show a top view of a rotating HRVA 201 having a region 203, where distribution of holes is different from the rest of the HRVA (thus an "asymmetrical HRVA"). In some embodiments the region 203 may be absent (cut off to a chord) or it can be solid without holes. In some embodiments (not illustrated) the region with non-uniform distribution of holes is wedge-shaped or is otherwise azimuthally asymmetric. The rotation of the HRVA is aligned with the rotation of the wafer (not shown), such that the region 203 is aligned with the wafer flat or missing die region, as the wafer rotates. FIG. 2B shows HRVA having nonuniform region 203 upon rotation to 90°. A controller which includes program instructions for synchronizing wafer rotation and HRVA rotation will be connected with the HRVA and the wafer in some embodiments. One embodiment is any embodiment described herein where a symmetrical HRVA is described, but substituting an asymmetrical HRVA to add an additional plating profile shaping element to the apparatus or method.

This embodiment can be used separately or in combination with the auxiliary electrode and other features disclosed herein. In some embodiments using rotating asymmetrical HRVA, the HRVA does not need to be positioned in close proximity of the wafer.

Stationary HRVA with a Rotating Shield

In another embodiment, the plating uniformity control for an azimuthally asymmetrical wafer is achieved by using a rotating shield positioned above or below the HRVA. In some embodiments, the rotating shield is positioned in close proximity of the substrate (e.g., with a distance to the platable surface of the substrate within about 0.1 of the substrate's radius, such as within about 0.2 of the substrate's radius, and, preferably, within about 4 mm). The shield is configured to eclipse the HRVA holes and is shaped such as to compensate for non-uniformity of current density distribution at the regions of the wafer having azimuthally asymmetric topographical features. The shield is aligned with the wafer flat and rotates at the same speed as the wafer, providing a continuous adjustment to current density experienced by the region where azimuthal surface variation exists. The shield can have a variety of shapes, such as a wedge shape, a gingko leaf shape, a bat-wing shape, etc. The synchronization of the shield and wafer rotating speeds can be done using a controller having program instructions for synchronization. More generally, the HRVA is not necessary in some embodiments, and the rotating azimuthally asymmetric shield is aligned with a selected portion of the substrate at a selected azimuthal position and is rotated with the substrate at the same speed, such that the selected portion of the substrate at a selected azimuthal position dwells in the shielded area for a different amount of time than an analogous portion at a different azimuthal position.

The embodiments described above are within the scope of this invention, but may be regarded as having more moving parts than are necessary to achieve azimuthal plating uniformity. By rotating the wafer bidirectionally or at variable speed, many of the implementation difficulties associated with moving parts can be avoided.

Bidirectional Wafer Rotation.

In another embodiment, the components, configured to produce a localized field proximate to the azimuthally asymmetric topographical features, are fixed and the wafer is rotated bidirectionally, for example clockwise and counterclockwise about an axis perpendicular to the surface of the wafer, such that the synchronization between the wafer and the field shaping components is achieved and thus the azimuthal asymmetry on the wafer is compensated for and uniform azimuthal plating is achieved. The components include stationary azimuthally asymmetric shields (including a stationary HRVA with an azimuthally asymmetric distribution of holes), azimuthally asymmetric auxiliary electrodes (thief cathodes, anodes, and anode/cathodes) and multi-segmented auxiliary electrodes, having segments distributed at various azimuthal positions. Bidirectional rotation can be used such as to adjust a dwell time of a selected portion of the substrate at a selected azimuthal position in a shielded area, or in an area proximate to an auxiliary electrode (or an electrode segment) such that this dwell time is different from a dwell time of an analogous portion of a substrate at a different azimuthal position (having the same average arc length and same average radial position). For example, if the wafer is rotated clockwise and counterclockwise to a different degree, it will spend more time at certain azimuthal positions, relative to others. These positions may be selected such as to correspond to azimuthal positions that are shielded or that are proximate to an azimuthally asymmetric thief or a thief segment. For example, if the wafer is rotated clockwise by 360 degrees and counterclockwise by 90 degrees, it will spend more time in the sector between 270-360 degrees. Furthermore, bidirectional rotation can tends to reduce or eliminate any particular directional wafer flow field bias.

Segmented Auxiliary Electrode (Thief Cathode/Source Anode or Anode/Cathode) or an Azimuthally Asymmetric Auxiliary Electrode with Bidirectional Wafer Movement.

As described above, when a segmented thief cathode or an azimuthally asymmetric thief cathode, which is adapted for diverting a portion of current from the edge of the wafer, is used to compensate for azimuthal non-uniformities on a wafer, and when the wafer is rotated unidirectionally, one way to achieve azimuthal plating uniformity is to move the thief cathode synchronously with the wafer so that the appropriate localized field configured to compensate for the azimuthal non-uniformity remains registered with the selected area of the wafer for which it was designed to compensate. Such thief cathodes may be segmented so that more than one area has azimuthal plating correction, for example, where the segments are arranged appropriately on a support which rotates in sync with the wafer during plating.

If the wafer is moved bidirectionally in a manner described above, then the secondary thief cathode can remain stationary, as the selected azimuthal position of the wafer, e.g., a missing die region will have a different dwell time in the proximity of the auxiliary electrode or its segment than a different azimuthal position of the wafer. This obviates a number of mechanical complexities. One embodiment is a plating apparatus configured for bidirectional movement of a wafer, a segmented secondary thief cathode configured to divert the plating current, wherein the apparatus is configured to adjust the field to compensate for azimuthal non-uniformities on the wafer. In this embodiment in the bidirectional rotation, the wafer rotates clockwise and counterclockwise to a different degree (or rotates to the same degree without making a full rotation, e.g., over selected arc length), such that the selected portion of the wafer at a selected azimuthal position dwells in proximity of a thief cathode segment for a different time (e.g., longer) than an analogous portion of the substrate at a different azimuthal position. In some embodiments, the selected segment of the cathode is powered differently from other segments (e.g., has a different level of current applied or different polarity from other segments. Another embodiment is a method of plating including rotating the wafer bidirectionally, relative to a secondary segmented thief cathode, so as to compensate for azimuthal non-uniformities on the wafer during plating. Although this embodiment was illustrated with a thief cathode diverting current, it can also be used with an auxiliary multi-segmented anode or anode/cathode. In these embodiments the HRVA may or may not be present and may or may not be rotated during plating. Typically, but not necessarily, the HRVA is a symmetrical HRVA as opposed to an unsymmetrical HRVA as described above. The secondary auxiliary electrodes operate to manipulate the field as described herein, but are not moved during plating.

Azimuthally Asymmetric Shields

In some embodiments, the apparatus is configured for rotating the wafer bidirectionally and the apparatus includes one or more stationary azimuthally asymmetric shields, configured for restricting plating current in the proximity of the substrate. The shields may be used independent of the HRVA, and may be placed above or below the HRVA plate blocking the HRVA holes, or the shield may itself be the HRVA having azimuthally asymmetric distribution of through-holes. In some embodiments the bidirectional rotation is adjusted such that a selected portion of the substrate at a selected azimuthal position (e.g., proximate to a notch or a missing die) dwells in the shielded area for a different time than an analogous portion of the substrate at a different azimuthal position. This may be accomplished, for example, if clockwise and counterclockwise rotations are performed to different degrees, such as to create a longer dwell time of a selected azimuthal portion of the wafer in a certain shielded position. Below are non-limiting examples of various implementations of azimuthally asymmetric shielding.

Stationary HRVA with a Segmented or Irregular Annular Shield:

In one embodiment, the plating uniformity control for an azimuthally asymmetrical wafer is achieved by using a stationary HRVA with an attached azimuthally asymmetric shield, where the azimuthally asymmetric shield is an annular shield which has one or more segments removed and/or one or more areas disposed azimuthally about the annulus that impart azimuthal asymmetry to the annular shield. The wafer is rotated bidirectionally, for example one or more rotations clockwise and then one or more rotations counter clockwise, such that the wafer areas in need of azimuthal plating compensation are azimuthally averaged, that is, positioned over the appropriate segments and/or aforementioned areas appropriately to provide field shaping for the azimuthally uniform plating to occur. The adjustment of the dwell time of a specific azimuthal position over the shield via adjustment of wafer rotating speeds and/or directions can be done using a controller having program instructions for synchronization.

In one embodiment, symmetrical HRVA is used in combination with an annular shield that attaches to the HRVA. In one embodiment, the annular shield (or spacer) is affixed to the HRVA, and the annular shield has a sector removed, a feature or area that imparts asymmetry to the annulus. Typically, when bidirectional wafer rotation is employed, the HRVA and attached shield are not moved. In one embodiment, the annular shield has a sector removed, as depicted in FIG. 3A.

Figure 3A:
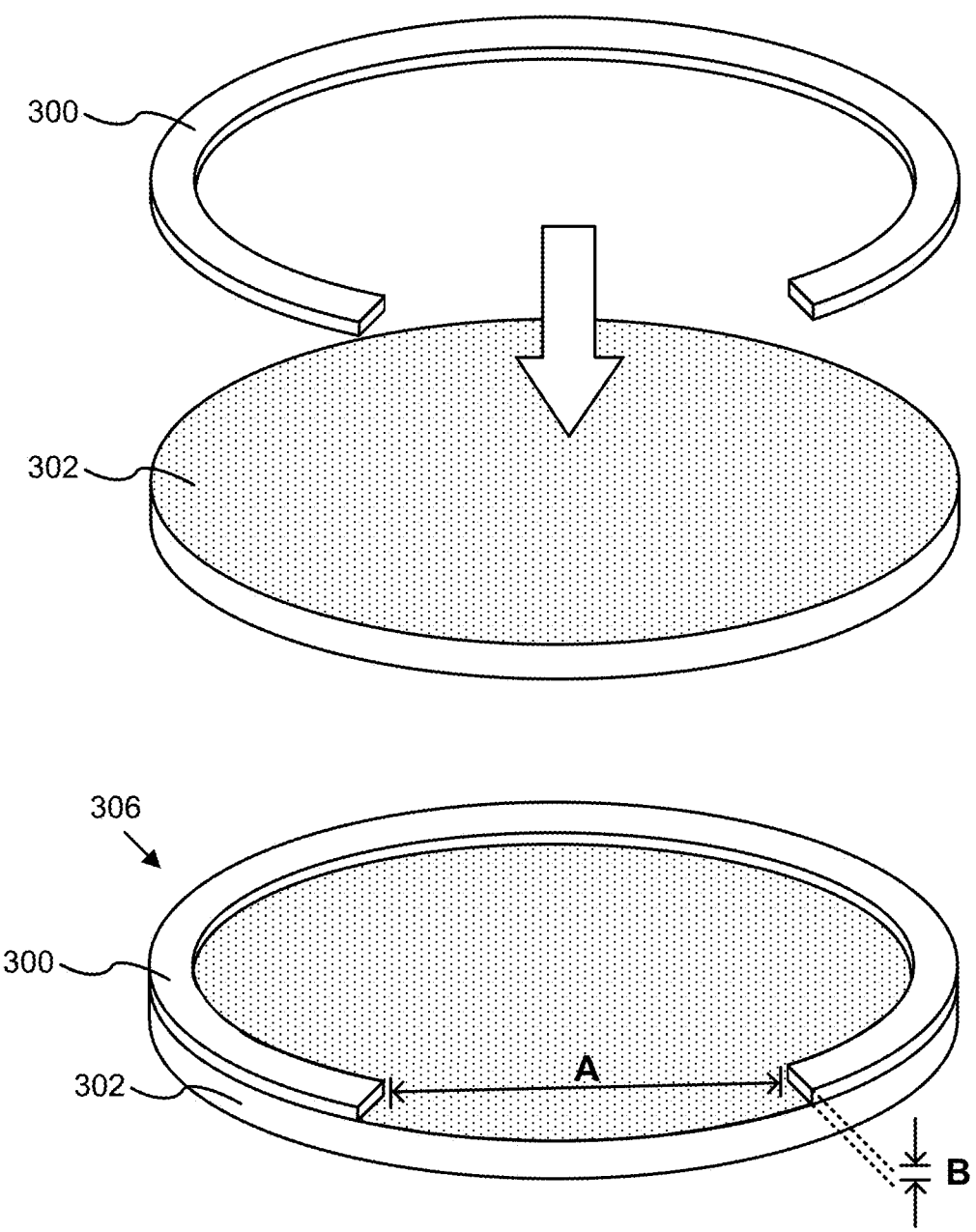
FIG. 3A shows a view of a plate with non-communicating holes and a shield.

Referring to FIG. 3A, an annular shield, 300, is mounted to a symmetrical HRVA, 302, as indicated by the heavy downward arrow. The bottom assembly, 306, shows the segmented shield in contact with the HRVA. In certain embodiments, since there is an impinging flow of electrolyte from the HRVA onto the wafer surface, and segmented shields such as 300 are commonly, but not necessarily, positioned proximate the wafer, the shield imparts lateral shearing forces at the wafer's plating face during plating, and particularly at the central axis of rotation on the plating face. This shearing is believed to reduce or eliminate the non-uniformity in deposition rate observed at the center of the wafer, particularly at higher plating rates. Thus segmented annular shields may also be called azimuthally non-uniform flow diverter (which can be thought of as a type of flow constrictor, i.e. constricting the majority of the electrolyte flow deflected from the wafer surface through the segmented region). In some applications, this type of flow diverter is used in applications where high plating rates are desired, for example wafer level packaging (WLP) applications. One example of such an application is described in U.S. provisional application Ser. No. 61/374,911, entitled, "High Flow Rate Processing for Wafer Level Packaging" by Steven T. Mayer et al., filed on Aug. 18, 2010, which is incorporated by reference herein for all purposes.

Annular shield 300 can be attached to or proximate the circumference of the flow shaping plate and extending toward the rotating work piece. In some embodiments depicted here, the top surface of the edge element of the shield provides a very small gap (e.g., about 0.1 to 0.5 mm) between the bottom of the wafer holder and flow diverter over the majority of the region between a substrate holder periphery and the top of the edge element. Outside this region (between about 30 to 120 degrees arc), there is a gap in the edge element that provides a relatively low resistance path for electrolyte to flow out of the nearly closed chamber. In other embodiments, where there is no segment removed from the annular shield, i.e., there is an area that imparts azimuthal asymmetry, the shield may or may not be as close to the wafer depending upon, for example, the amount of desired electrolyte flow.

FIG. 3A depicts how segmented annular shield 300 combines with HRVA 302 to form assembly 306. Annular shield 300 can be attached, for example, using screws and the like (not shown) or assembly 306 can be a unitary body milled from, for example, a block of material. Assembly 306 is positioned in close proximity to the substrate to be plated. In this way, a confined space or pseudo chamber is formed between the wafer and the flow shaping plate wherein the majority of the electrolyte impinging on the wafer surface exits through the slotted portion of 300. Dimension A, which may be defined as an angle or a linear dimension for a ring of defined radius, can be varied to allow more or less field changing area (and in this example flow through the slot) and dimension B can be varied to create a larger or smaller volume in the aforementioned pseudo chamber.

Figure 3B:
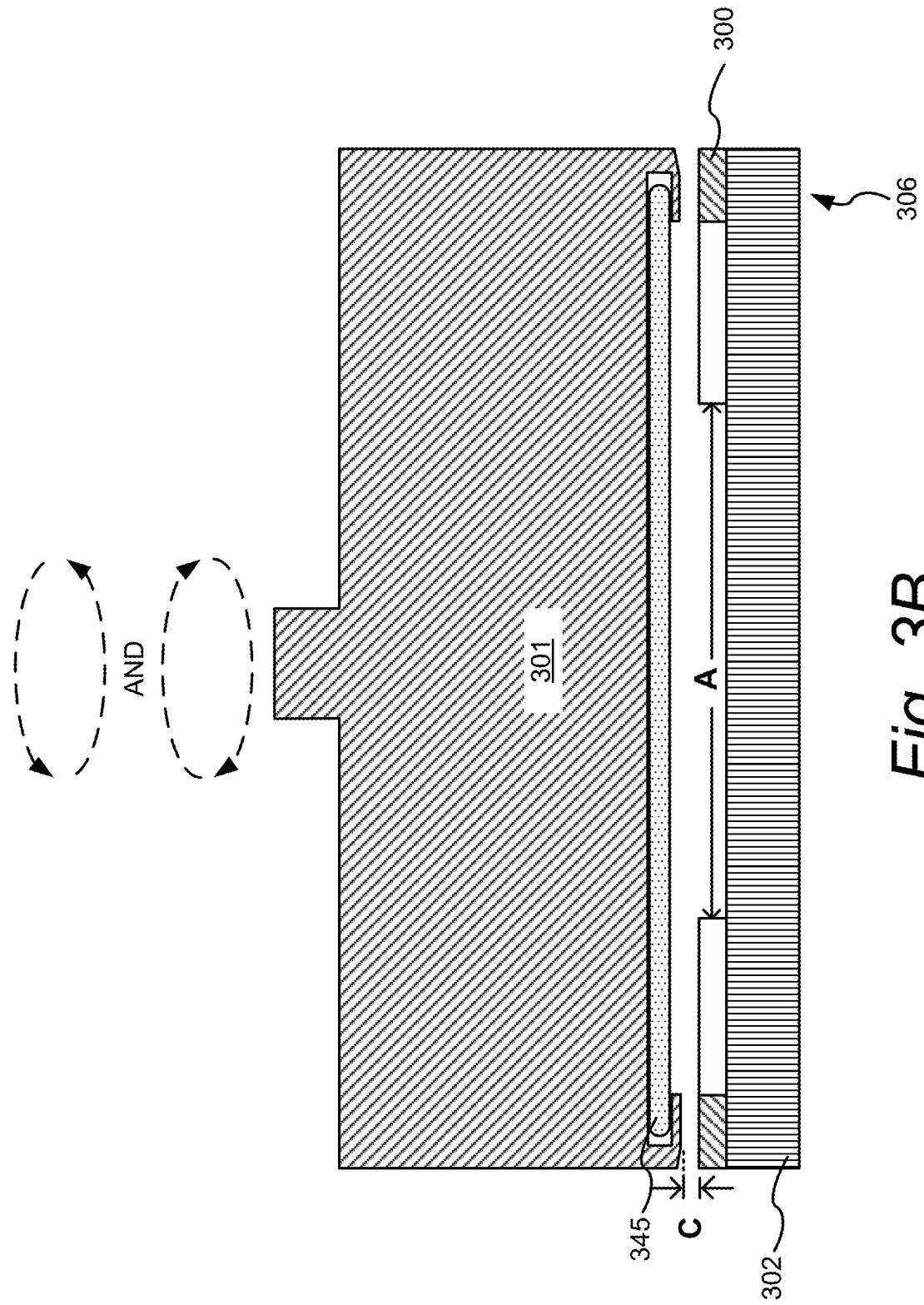
FIG. 3B shows a cross-sectional view of an assembly illustrated in FIG. 3A, in relation to the wafer and wafer holder.

FIG. 3B is a cross sectional depiction of assembly 306 positioned in close proximity to a wafer holder assembly 301, which holds wafer 345 and can rotate the wafer bidirectionally during plating as indicated by the curved arrows at the top of the figure. In certain embodiments, a dimension C, which is a gap between the top of spacer 300 and the bottom of assembly 301, is on the order of about 0.1 to 0.5 mm, in another embodiment about 0.2 to 0.4 mm.

During plating, since the shield shapes the field differently in the sector defined by the cut out segment, the wafer is rotated back and forth, under the appropriate timing and synchronization with the shield, in order to achieve uniform azimuthal plating in the areas on the wafer with azimuthal non-uniformity.

In some embodiments the shield having an annular shape with a removed sector is not affixed to the HRVA but is rotated during electroplating, preferably at a speed that is different than the speed of the wafer, which helps optimize the flow of electrolyte in the proximity of the wafer.

As discussed, the annular shield need not be segmented. For example, it may include a portion that imparts azimuthal asymmetry (in one embodiment, the shield includes both at least one segmented portion and at least one portion that imparts azimuthal asymmetry). FIG. 4 depicts a number of exemplary annular shields, including shield 300 and 400-475. In FIG. 4, the annular shields are depicted from a top view as attached atop a symmetrical HRVA. Shields 400-475 are shields having a portion (area) that departs from annularity, that is, that imparts an azimuthally asymmetric field. That is, along a circle or annulus which includes that portion of the shield that departs from regular annularity, there is not a uniform plating field across the entire circle or annulus.

It is important to note that although shield 300 is depicted as having uniform thickness (dimension B as depicted in FIG. 3A) this is not necessary. In one embodiment, the shield thickness varies. For example, the shields, 400-475, in FIG. 4A may be tapered in thickness. For example, referring to shield 405, in one embodiment the shield is of uniform thickness. In another embodiment, the shield is tapered from the center portion of the shield to the outer portion, for example, thinner at the center portions and becoming thicker toward the outer perimeter along radius D. This thickness variation may be desired for efficient electrolyte flow, for example from the center of the wafer outwards. This is analogous to the flow imparted by the segmented annular shield, 300. This tapering can be from the inner to out portions along the entire annulus as well, not only the irregular portion of the annulus.

Figure 4A:
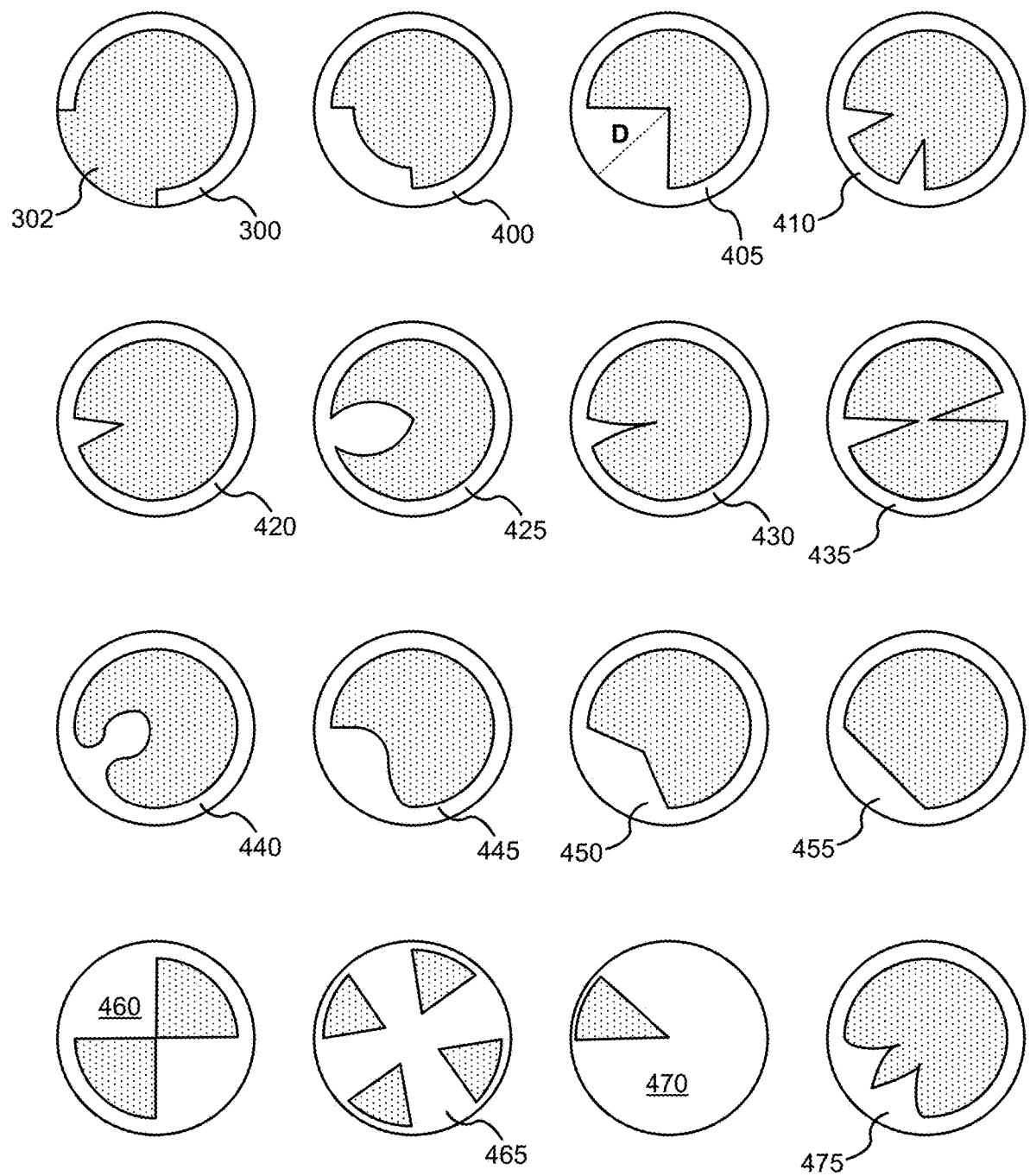
FIG. 4A illustrates top view of a variety of azimuthally asymmetric shields residing over a plate having non-communicating holes.
Figure 4B:
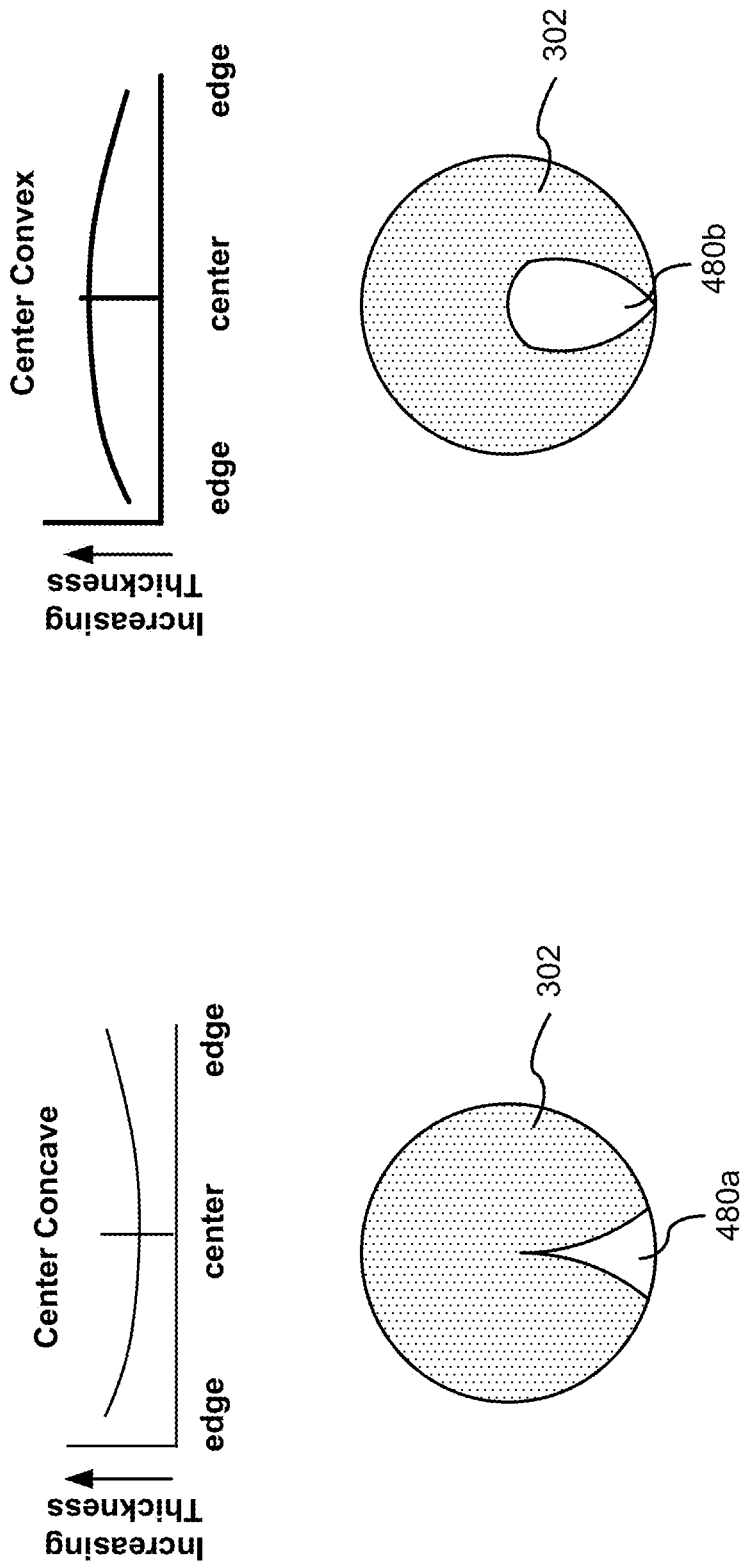
FIG. 4B illustrates shields, which are further configured to correct radial non-uniformity.

The shape of the portion of the annular shield (or independent shield described herein) may be tailored to accommodate not only azimuthal plating non-uniformity but also radial non-uniformity. Referring to FIG. 4B, for example, if there is a radial plating profile that is concave (as depicted in the graphical representations at the top left of FIG. 4B) then the shield or portion of the annular shield that extends past (interior to) the regular annular portion of the shield may be shaped to compensate for the concave radial plating profile. In this example, shield 480a, is thinner towards the center of the HRVA 302 so that the center portion of the wafer, when passing over the shield, will have less shielding and therefore more plating than outer portions that encounter more shield area and thus less plating. In another example, where there is a convex plating profile, the shield (or portion of annular shield) 480b is shape so that there is less shielding toward the perimeter of the wafer and more toward the center of the wafer. Asymmetric shield portions, for example as depicted in FIG. 4A, for example in shields 440 and 445, as opposed to shields 400-435, and 450-475 which are symmetric about a radius that bifurcates that portion of the shield that varies from annularity, may be desired depending upon the azimuthal non-uniformity on the wafer and the rotation sequence of the wafer during plating. Thus, as depicted in shields 400-475, the area of the portion of the annular shield that deviates from annularity may be symmetric or not, depending upon the plating desired and the azimuthal asymmetry on the wafer to be plated.

As described, these non-uniformities in the field created by the various combinations of shielding and thieving described herein are exploited by combining plating time and synchronization with or without the asymmetric portion of the field to compensate for azimuthal non-uniformities on the wafer surface and achieve uniform azimuthal plating. In the embodiments described in this section, bidirectional wafer rotation is used in combination with the shields described. The timing and synchronization will depend on, among other factors, the azimuthal non-uniformities on the wafer, the shield configuration, the amount of plating desired, the rate of plating, and the like. The synchronization of the shield features with certain areas of the wafer, wafer rotation speeds and rotation direction can be done using a controller having program instructions for synchronization. Since the areas of the wafer with azimuthal non-uniformities wafer will spend a certain period of time over (or synchronized with) certain features of the shield, the described methods for obtaining azimuthal plating uniformity are sometimes referred to as "dwell shielding" methods. To obtain a particular "dwell" over a shield, the wafer may be rotated at a certain rotation rate or speed (vs a rate over a non-shielded area), the shield may be wider, the wafer rotated a certain arc to ensure dwell time, and combinations of these.

Stationary HRVA with a Segmented or Irregular Annular Shield and One or More Additional Fixed Shields In another embodiment, the plating uniformity control for an azimuthally asymmetrical wafer is achieved by using an annular shield as described in the previous section, for example a segmented shield attached to a symmetrical HRVA, in addition to one or more fixed shields in between the annular shield and the wafer. The one or more fixed shields are configured to eclipse the HRVA holes and are shaped such as to compensate, along with bidirectional rotation of the wafer and the segmented annular shield, for non-uniformity of current density distribution at the regions of the wafer having azimuthally asymmetric topographical features (and to compensate for radial non-uniformity).

Figure 5A:
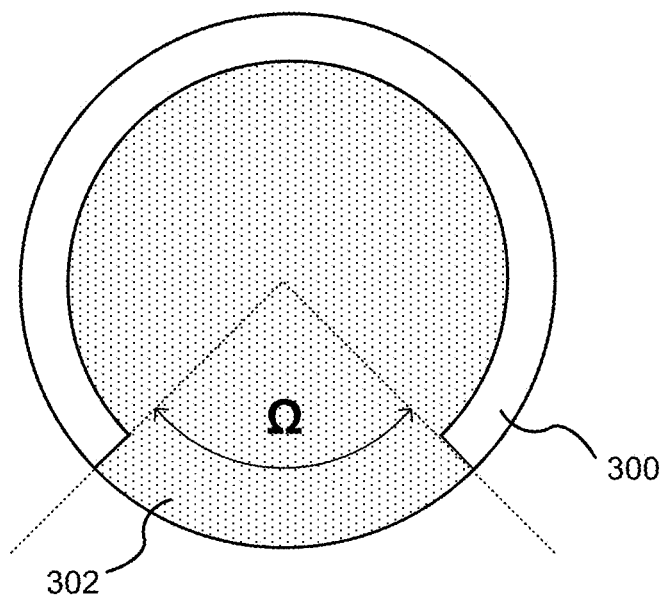

FIG. 5A depicts annular segmented shield, 300, as described above, on a symmetrical HRVA, 302. The angle, Ω, in this example 90°, defines the cut out segment and, as described above, along with the proximity to the wafer defines not only field shaping about the annulus of the wafer registered with the shield during plating, but also electrolyte flow about the wafer surface. The number of fixed shields and shape depend upon the wafer's azimuthal non-uniformities, the radial non-uniformity to be overcome, etc.

Figure 5B:
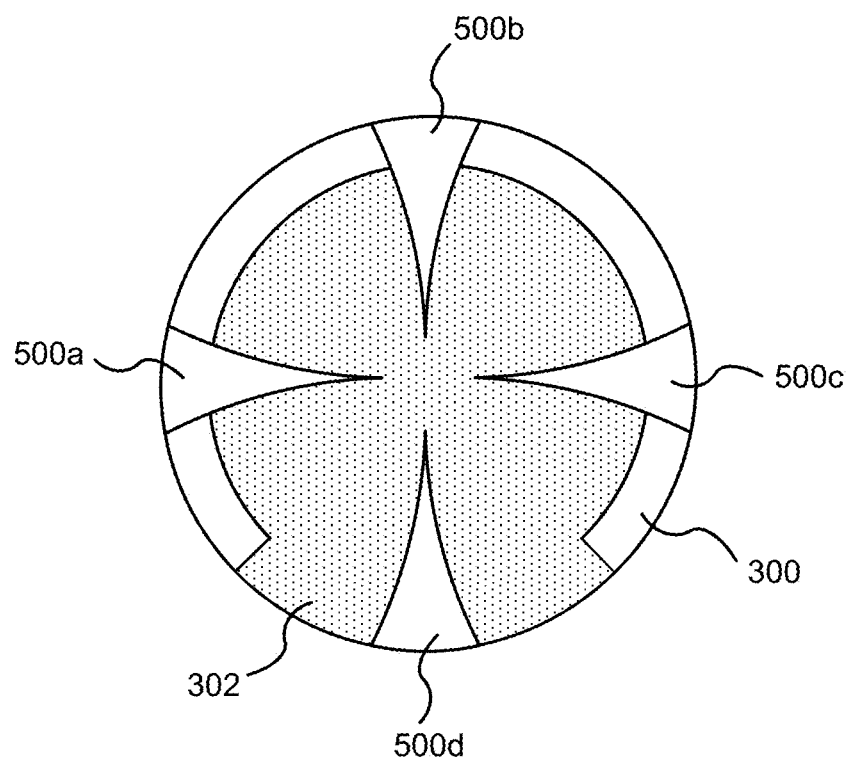

In one embodiment, the number of fixed shields, N, used in conjunction with shield 300 is defined by a formula, N=360°/Ω. For example, when Ω is 90° as in FIG. 5A, then N would be four. FIG. 5B depicts annular shield 300 with four fixed shields, 500a-d, arranged in a regular pattern about the HRVA 302. In this example, shields 500a-d are shaped to compensate for what would otherwise be a concave radial plating profile (e.g., see FIG. 4B and associated description). The shape of each shield can vary independently in a given apparatus and/or the shields need not be arranged in a regular pattern about the HRVA. In one embodiment, whatever their shape, the shields are arranged in a regular pattern as depicted in FIG. 5B, that is, where one shield is centered in the open portion of the annular shield (in this example shield 500d occupies that position). It is important to note that the embodiment described using a segmented annular shield with one or more additional fixed shields, for example as depicted in FIG. 5B, can be implemented with, for example as depicted in FIG. 5C, an annular shield having portions that protrude into the same space as shields 500a-c, along with a separate shield 500d. In another example, as depicted in FIG. 5D, a single shield, 500f is used. Shield 500f has a unitary body, for example milled out of a solid polymer or pressure molded. In this example, the portion of shield 500f as indicated "E" is thinner than the thickness, B, of the remainder of the shield in order to allow electrolyte flow as described above in relation to the segmented annular shield. The sub-portion of portion E of shield 500f that is analogous to separate shield 500d (as depicted in FIG. 5C) can also be, for example, the same thickness B as the remainder of the shield, as depicted in the bottom most portion of FIG. 5D. In this embodiment, when the wafer is positioned as described in relation to FIG. 2B, there are essentially two "higher flow" outlets for electrolyte to exit the pseudo-chamber formed when the wafer holder assembly is proximate the HRVA with shields. Of course, as described in relation to FIG. 4A, the portions of shield 400f that correspond to individual shields 500a-d in FIG. 5B can be tapered, for example, thinner along dimension B in the center and becoming thicker toward the perimeter of the shield.

There are advantages to both having separate shields as depicted in FIGS. 4A and 4B, and having a single shield as in FIG. 5D. For example, having separate shields as described in relation to FIG. 5B allows one to switch out shields 500a-d, without having to change the annular shield 300. Also, the shields 500a-d are mounted between the annular shield and the wafer, so there is corresponding support structure to accomplish this. As well, when maximum flow through the segment area is desired, having separate shields above the annular shield aids this flow. A single shield, for example as described in relation to FIG. 5D, can be more simple to install, manufacture and operate due to less parts, for example, support for the separate shields 500a-d.

Figure 5E:
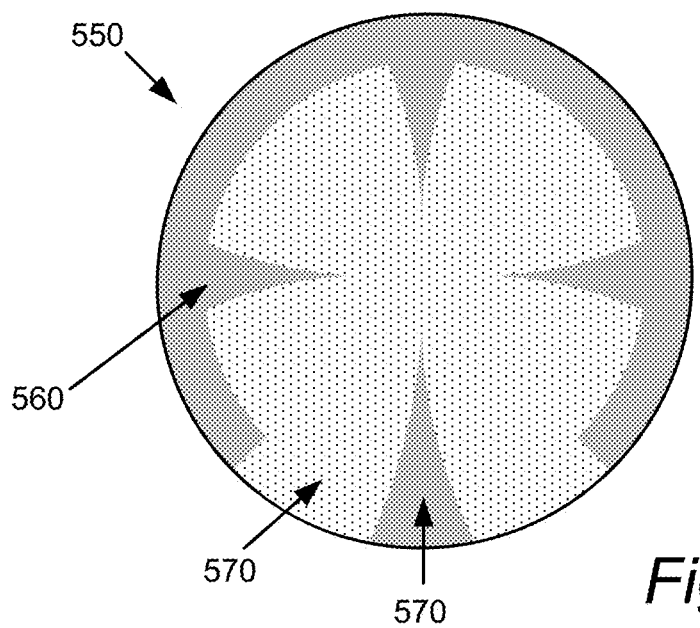
Figure 5F:
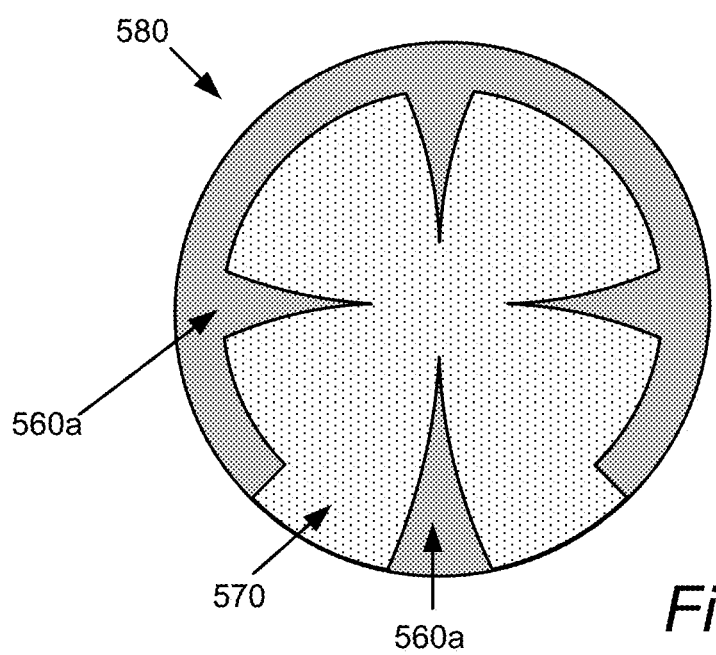

It is also important to note that the shields described thus far in relation to a HRVA are described in terms of additional components, that is, separate from the HRVA. This need not be so. For example, FIG. 5E depicts a HRVA, 550, (analogous to that described in relation to FIGS. 2A and 2B) where portions of the HRVA have less flow holes, or in this example, no flow holes, areas 560, and in this example, a single area, 570, that does have the 1-D through holes. In this embodiment, the shielding is produced by the lack of holes in certain areas of the HRVA. Of course, the aforementioned electrolyte flow characteristics will be different when the shielding components, as in HRVA 550, have no vertical element, that is, thickness B. In another embodiment, as depicted in FIG. 5F, the analogous areas, 560a, not only have no through holes but are also raised, for example to height B, above the surface of the HRVA, 570, having the holes. In the examples described in relation to FIGS. 4E and 4F, either the through holes are formed selectively in the HRVA disk to form the pattern shown, or, in another example, the through holes are made through the entire structure and then selectively blocked, for example, in areas 560 and 560a. The latter embodiment has the advantage of using existing drilled materials and, for example, using screen printing to block the holes of interest. In another embodiment, the holes to be sealed are melted shut using an iron that is shaped in the pattern desired, or for example, moved about the surface of the HRVA to melt shut the desired holes. The holes may be melted shut in any number of ways including, using a conductive heat source a convective heat source, an inductive heat source and a radiative heat source.

Figure 6:
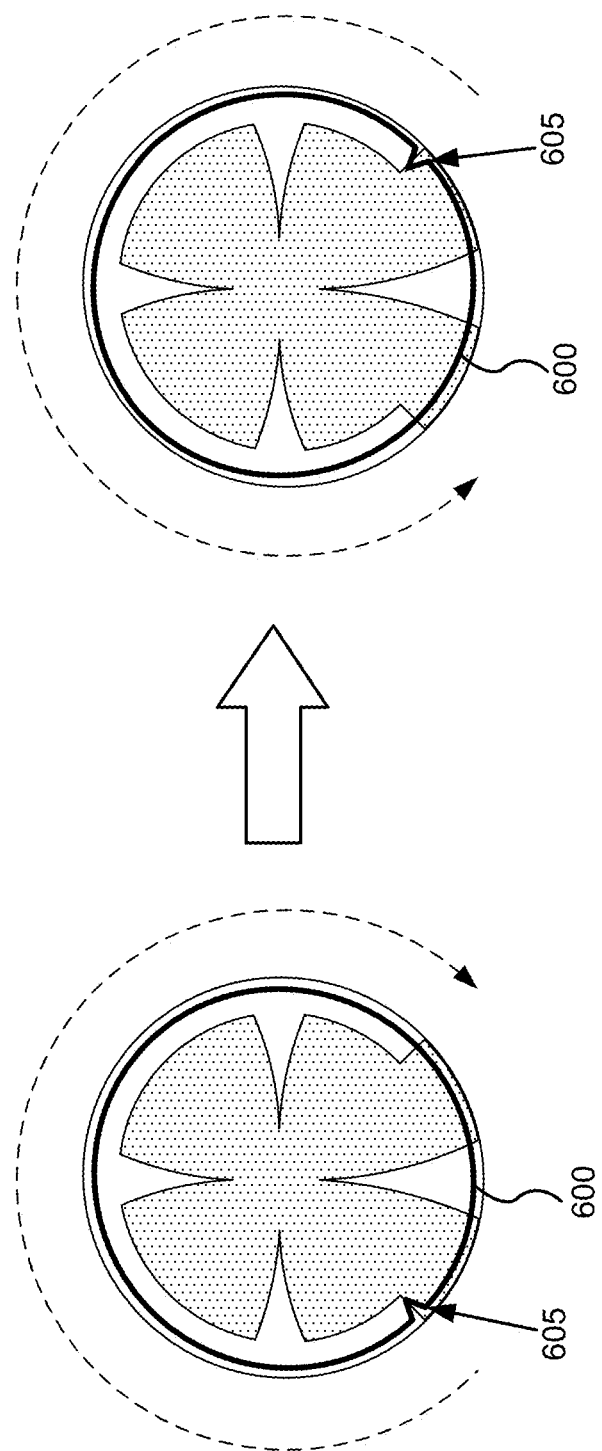
FIG. 6 shows a top view of a bidirectionally rotating wafer in a system containing azimuthally asymmetric shielding.

During plating, the wafer is rotated, for example bidirectionally, over the HRVA and shields in order to obtain uniform plating both radially and azimuthally. For example, referring to the shield arrangements in any of FIGS. 5B-F, during plating, in one embodiment, the wafer is rotated bidirectionally about arcs of about 270°. For example, referring to FIG. 6, which depicts HRVA 580 of FIG. 5F, aspects of a plating process are described. A wafer, 600, which has a registration notch, 605, is positioned over HRVA 580. The electrolyte flow passes through HRVA 580 and impinges on the surface of wafer 600. For convenience, wafer 600 is depicted as an outline only so that the relative positioning of wafer 600 and HRVA 580 can be seen, and wafer 600 is depicted as having a smaller diameter than HRVA 580. The registration notch is proximate the area that needs the least amount of edge shielding, as imparted by the annular portion of the shield elements, therefore as depicted in the left-hand portion of FIG. 6, the notch is started at the leading edge of the opening (segment) in the annular shield and the wafer is rotated 270° clockwise so that notch 605 ends up at the other edge of the open segment of the shield. In this way, the areas on the wafer adjacent to the notch, those requiring less edge shielding, get more exposure to the field and thus more plating. Since the wafer is rotated 270°, each point on the wafer passes by three interior shield areas, represented by, for example, shields 500a-d in FIG. 5B. In one embodiment the wafer is rotated in this way, bidirectionally, one or more times for each direction, clockwise and counter clockwise, until the desired plating is achieved. As described, any number of combinations of annular shield (thickness, width and height, segmented or not) and additional "interior" shield elements, for example shields 500a-d (thickness, width and shape can vary depending upon the needs) can be used to tailor the plating uniformity both radially and azimuthally.

Plating with Variable Rotation Wafer Speed

It is important to note that although the embodiments described above are in terms of unidirectional or bidirectional wafer rotation where the rotation is a portion of a full 360 degrees rotation, azimuthal corrections can also be performed by using variable speed wafer rotation. That is, if a wafer is rotated at a certain angular speed, R1, over a given area, for example a holed area of the HRVA, and then rotated at a different angular speed, R2, over another area, for example a shielded area, the similar results can be obtained. That is, varying the rotation speed during any individual full rotation is one way to adjust and obtain azimuthal variable amounts of time-averaged shielding to which the wafer is exposed. One embodiment is any of the above described embodiments, where the wafer speed is varied during each rotation, or alternatively, the speed may be varied during a single rotation or in some rotations and not others. Also, the wafer speed may be varied only while spinning in one direction of rotation (e.g. clockwise) and not the other direction (e.g. counterclockwise), or it may be varied in both rotational directions. One embodiment is any embodiment described in relation to bidirectional wafer rotation, but using either unidirectional rotation where the rotation speed is varied during one or more single rotations or a bidirectional rotation where the rotation speed is varied.

Figure 7:
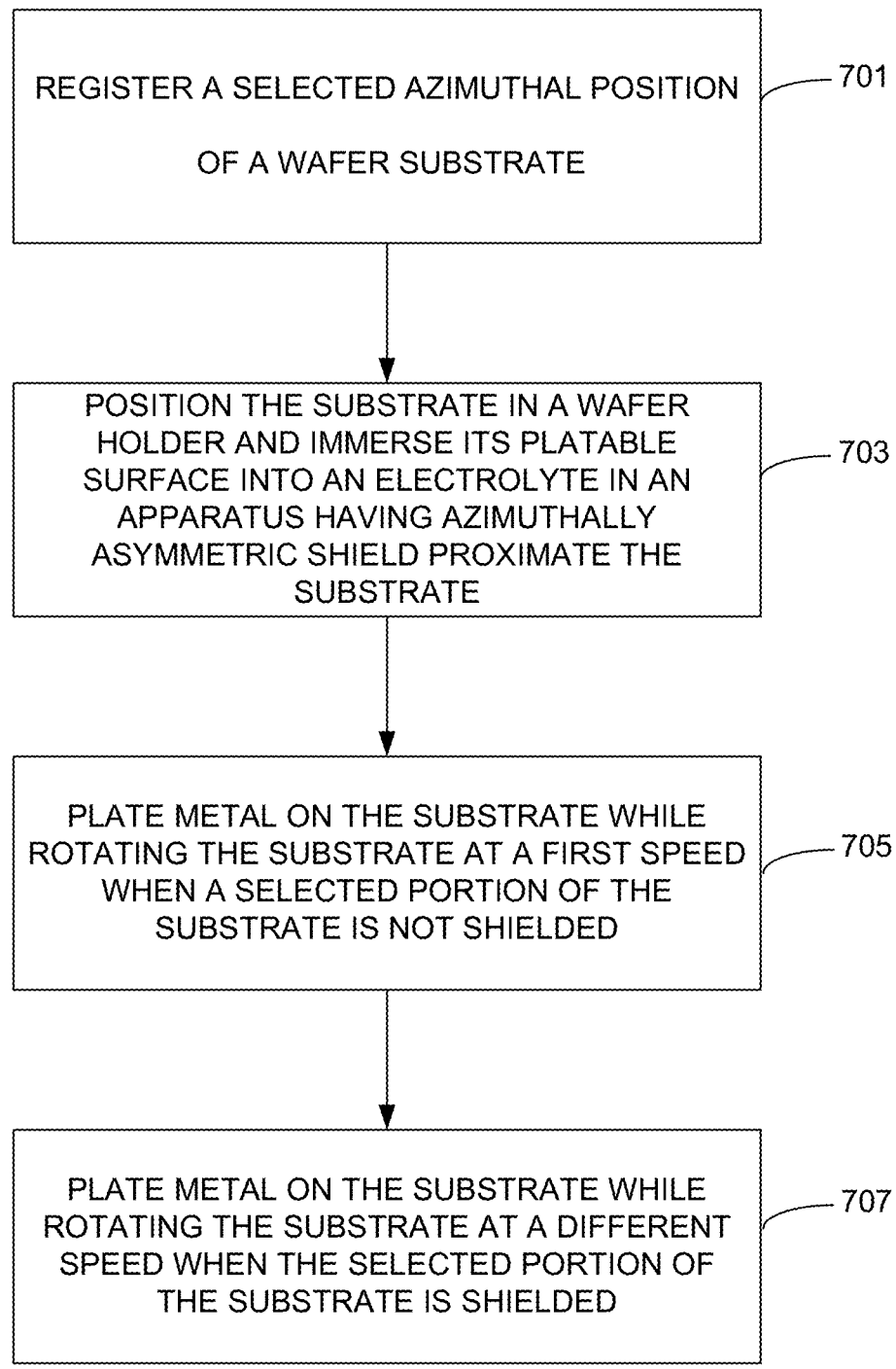
FIG. 7 is a process flow diagram for a process in accordance with one of the embodiments.
Figure 8:
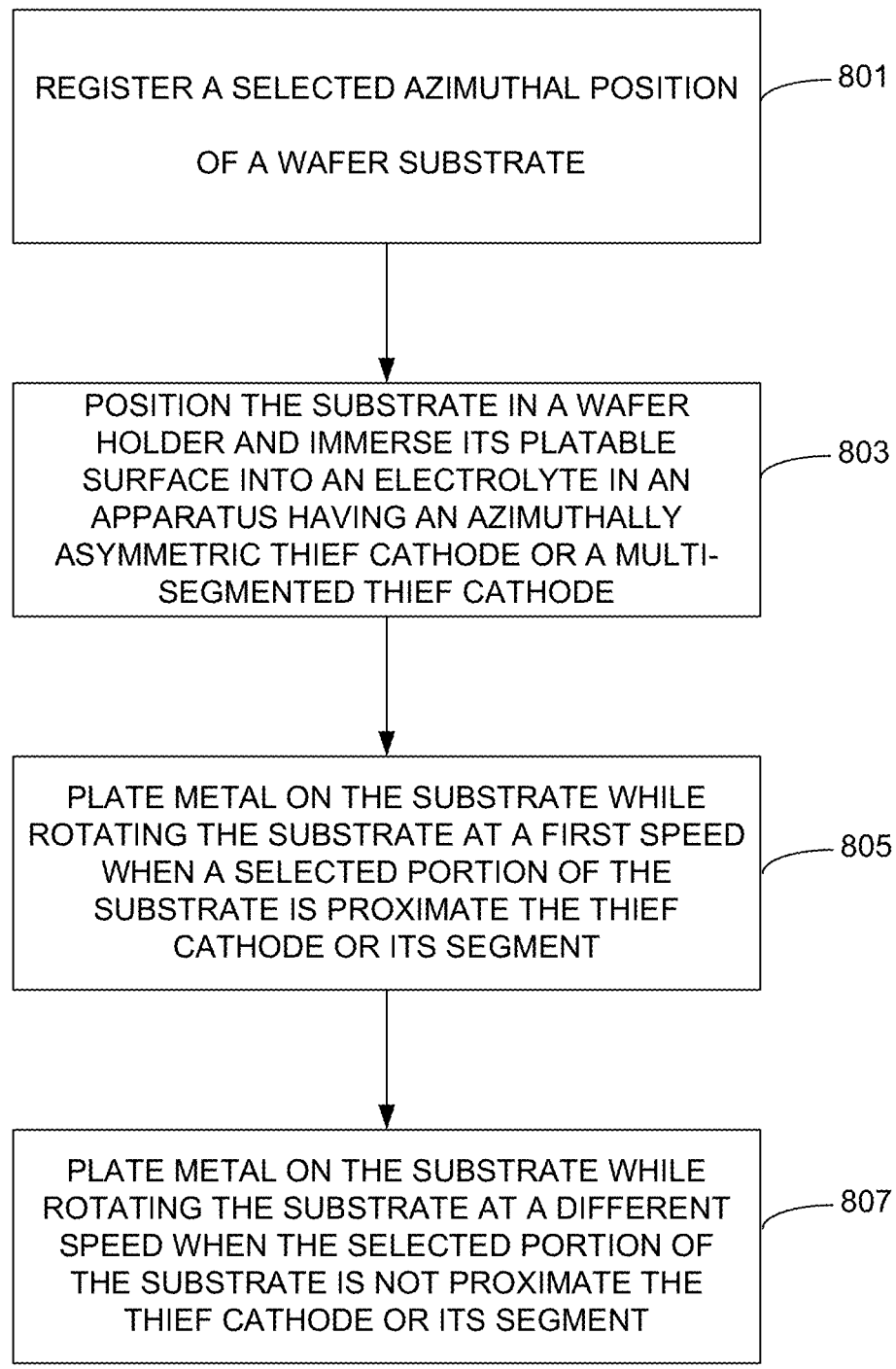
FIG. 8 is a process flow diagram for a process in accordance with one of the embodiments.

These processes are illustrated by the process flow diagrams shown in FIG. 7 and FIG. 8. The first process is implemented in an apparatus having one or more azimuthally asymmetric shields in the proximity of the substrate. Examples of shields include shields positioned above the HRVA, below the HRVA, or in the absence of the HRVA. In some embodiments the azimuthally asymmetric shield is a HRVA with an azimuthally asymmetric distribution of holes. The process starts in operation 701 by registering a selected azimuthal position on the wafer. For example azimuthal position of a notch may be registered by an optical aligner and recorded in the memory. In operation 703, the substrate is provided into the substrate holder and is immersed into electrolyte. In operation 705 the substrate is being plated, while being rotated at a first speed when the selected portion of the substrate is not in the shielded area. In operation 707, the substrate is rotated at a different speed, when the selected portion of the substrate passes through the shielded area. Thus, one full rotation of the wafer includes a period of rotation at a first speed, and a period of rotation at a different speed, where the period of rotation at the second speed occurs at least partially when the selected portion of the substrate passes through the shielded area. As it was previously mentioned, the shields are preferably disposed in close proximity to the substrate, such as within about 4 mm of the platable surface, or within a distance that is equal or less to 0.1 of the substrate's radius. The variable speed rotations can then be repeated as necessary. For example, one full rotation may include a period of rotation at 20 rpm or more followed by a period of rotation at 10 rpm or less, where plating includes at least 5 full variable-speed rotations. In one example, one full rotation of the wafer includes a period of rotation at about 40 rpm, when the selected portion of the wafer is not shielded, followed by a period of rotation at about 1 rpm for about 10-15 degrees while the selected portion of the wafer passes through the shielded area. Plating may include at least about 10, such as at least about 20 variable-speed rotations. It is understood that not necessarily all rotations in electroplating are variable speed. For example, the plating process can include both constant-speed full rotations and variable speed full rotations. Further, variable speed rotation can be implemented both during unidirectional and bidirectional rotation in the electroplating process.

FIG. 8 illustrates a process flow diagram for plating in an apparatus having an azimuthally asymmetric thief (e.g., a C-shaped thief) or a multi-segmented thief cathode. The process starts in 801 by registering the desired azimuthal position with an optical aligner. In 803, the substrate is placed into the wafer holder and is immersed in the electrolyte. In 805, plating is performed while the wafer is rotated at a first speed, when the selected portion of the substrate at the selected azimuthal position is in the proximity of the azimuthally asymmetric thief cathode or in the proximity of a segment of a multi-segmented cathode. In 807, the speed of rotation is changed (the wafer is slowed down or accelerated), when the selected area is not in the proximity of the thief. Thus, in one full rotation, the wafer rotates for a period of time at a first speed, when the selected area is in the proximity of a thief or a thief segment, and for a period of time at a different speed, when the selected area is further away from the thief. Variable-speed rotation may be repeated for as many cycles as necessary, e.g., at least 10 cycles.

It is understood that in some embodiments, where multiple shields and/or multiple thief segments are contained in the apparatus, and/or where the wafer contains multiple selected areas where azimuthal uniformity needs to be corrected, one full rotation of the wafer may include multiple periods of alternating slower and faster rotation, such as to register the required shields and/or thieves with all the necessary selected azimuthal portions.

It is also noted that both bidirectional rotation and variable speed rotation uniformity correction methods can be characterized by the capacity to provide different dwell times for a selected portion of a substrate at a selected azimuthal position relative to dwell times of an analogous portion of the substrate at a different azimuthal positions, wherein the dwell times refer to dwell of the selected portion in a shielded area on in a proximity of a thief cathode (or its segment). As it has been previously mentioned, these embodiments may be also used with other types of auxiliary electrodes, such as auxiliary azimuthally asymmetric anodes, and anode/cathodes, as well as multi-segmented anodes and anode/cathodes.

Figure 9:
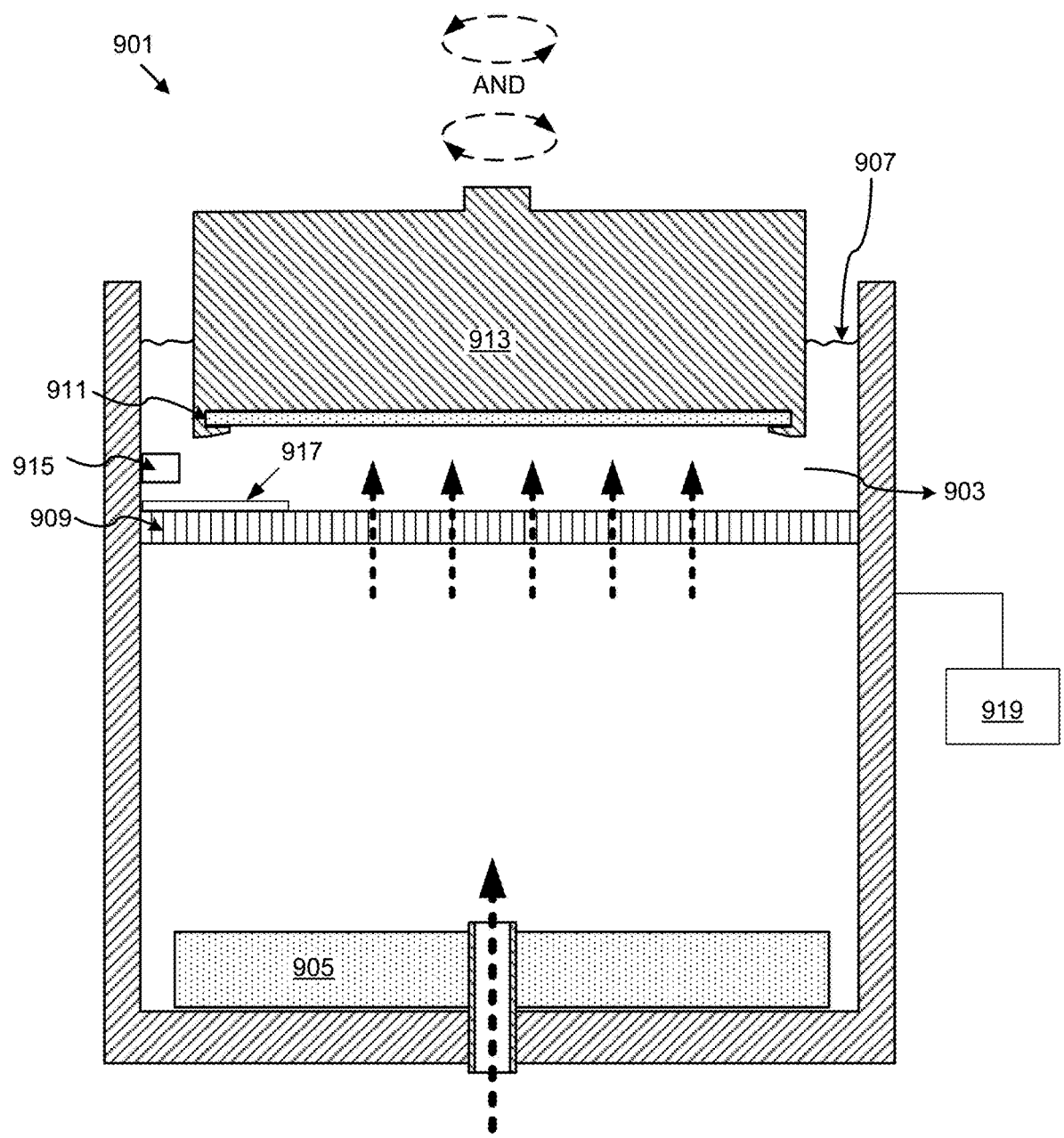
FIG. 9 is a schematic cross-sectional view of an electroplating apparatus in accordance with an embodiment provided herein.

Patterning Method/Apparatus:

A schematic simplified cross-sectional view of an electroplating apparatus, in accordance with one exemplary embodiment presented herein, is shown in FIG. 9. This non-limiting example illustrates an apparatus with both an azimuthally asymmetric thief cathode (which, in other embodiments, can be an anode or anode/cathode) and an azimuthally asymmetric shield located above the HRVA. It is understood that in other embodiments, the plating cell may have different components, or some components may be absent, e.g., HRVA may be absent, and/or the apparatus may contain a shield without the thief, or a thief without the shield. As depicted in FIG. 9, plating apparatus 901 includes a plating cell, 903, which houses an anode 905. The anode may be an active anode (i.e. an anode which includes a metal that is being plated, such as copper or tin) or an inert anode. In this example, electrolyte 907, which includes ions of platable metal, and an acid is flowed into cell 903 through anode 905 and the electrolyte passes through a flow shaping element 909 (also known as a HRVA, or an ionically resistive ionically permeable element) having vertically oriented (non-intersecting) through holes through which electrolyte flows and then impinges on wafer 911 which is held in, positioned and moved by, wafer holder 913. In the depicted example the wafer holder is configured for bidirectionally rotating the wafer, and may also be configured for rotating the wafer at variable speeds. The impinging flow of electrolyte is depicted by vertical arrows, which illustrate electrolyte flowing through the channels of the flow-shaping element 909, upward to the wafer 911. An azimuthally asymmetric thief cathode 915 (e.g., a C-shaped thief residing about the portion of the wafer perimeter) resides over the flow shaping element 909. More generally, the thief may reside anywhere in ionic communication with an electrolyte (e.g., within the plating bath or in a separate chamber). The thief cathode 915 is connected to a negative terminal of a power supply (not shown) and is configured to divert ionic current from the wafer substrate. In addition, an azimuthally asymmetric shield 917 (e.g., a wedge-shaped shield) is position over the flow shaping element 909 in the proximity of the wafer substrate.

Preferably, in order to optimally control the uniformity, both the flow shaping element and the shield are positioned in close proximity to the substrate. In some embodiments the distance from a bottom surface of the substrate holder during electroplating and the top surface of the flow shaping element is between about 1 and 5 mm. The shield 917 preferably resides within about 4 mm of the bottom surface of the substrate holder.

In some embodiments the flow shaping element is between about 5 mm and about 10 mm thick and the substrate-facing surface of the flow shaping element is separated from the plating face of the substrate by a distance of about 10 millimeters or less, more preferably by a distance of about 5 millimeters or less during electroplating. In some embodiments, the flow shaping element is a disk having between about 6,000-12,000 channels.

The wafer 911 typically has a plurality of electrical contacts made to a periphery of the wafer, and is electrically connected to a negative terminus of a power supply (not shown), such that the wafer, having a conductive layer thereon, serves as a cathode during electroplating. The positive terminus of the power supply is electrically connected to the anode 905. When potential difference is applied, an ionic current, which moves ions of platable metal and protons to the wafer surface, results. The ions of metal are reduced at the wafer surface, forming a layer of electroplated metal on the surface of the substrate. The uniformity of plated layers depends on distribution of the plating field in the proximity of the substrate, which in turn, can be adjusted by shielding with the azimuthally asymmetric shield 917, and current diversion with the azimuthally asymmetric thief 915, using methods provided herein.

A controller 919, electrically connected to the components of the electroplating apparatus 901 includes program instructions, specifying necessary parameters for electroplating, such as levels of current applied to the wafer and the thief, parameters related to delivery of electrolyte to the plating bath, and speeds of rotation of the substrate and direction of rotation. The controller 919 includes program instructions for performing all methods described herein, such as registering the selected azimuthal position of the wafer such that it dwells differently in the shielded area or in the proximity of the thief in comparison with an analogous region of the wafer at a different azimuthal position. The controller will typically include one or more memory devices and one or more processors. The processor may include a CPU or computer, analog and/or digital input/output connections, stepper motor controller boards, etc.

In certain embodiments, the controller controls all of the activities of the deposition apparatus. The system controller executes system control software including sets of program instructions for controlling wafer rotation speeds, registration of azimuthal position, etc.

Typically there will be a user interface associated with controller. The user interface may include a display screen, graphical software displays of the apparatus and/or process conditions, and user input devices such as pointing devices, keyboards, touch screens, microphones, etc.

The computer program code for controlling the deposition processes can be written in any conventional computer readable programming language: for example, assembly language, C, C++, or others. Compiled object code or script is executed by the processor to perform the tasks identified in the program.

It is understood that the depiction shown in FIG. 9 is a simplified scheme of one embodiment, which does not show all of the details of the electroplating apparatus that were described herein. For example, as it was described, in some embodiments, the asymmetric shield is an asymmetric HRVA, and in some embodiments components of the plating cell, such as thieves, shields, or the HRVA are configured to be rotated.

The apparatus and methods described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench;

(5) transferring the resist pattern into an underlying film or workpiece by using a dry or plasma-assisted etching tool; and (6) removing the resist using a tool such as an RF or microwave plasma resist stripper. One embodiment is a method as described herein further including: applying photoresist to the wafer after electroplating for both radial and azimuthal uniformity; exposing the photoresist to an energy source; patterning the resist and transferring the pattern to the wafer; and selectively removing the photoresist from the wafer. One embodiment is system including an apparatus as described herein further comprising a stepper. In some embodiments, used in TSV and WLP processing, the photoresist is applied and patterned to provide a surface having one or more recessed features prior to electroplating; the features are filled with metal during electroplating, and the photoresist is removed after electroplating.

Azimuthally Asymmetric and Multi-segmented Anodes and Azimuthally Asymmetric and Multi-segmented Electrodes Configured to Function Both as an Anode and a Cathode In the preceding sections the auxiliary electrodes, such as azimuthally asymmetric and multi-segmented electrodes were primarily exemplified by thief cathodes,—negatively biased electrodes which are configured to divert ionic (plating) current. It is herein provided that in other embodiments—auxiliary azimuthally asymmetric and auxiliary multi-segmented anodes,—positively biased electrodes which are configured to donate plating current, are used to make azimuthal corrections, instead of thieves. Yet in other embodiments, azimuthally asymmetric and multi-segmented electrodes configured to function both as an anode and a cathode (also referred to as anode/cathodes) are used instead of thieves. The anode/cathode is configured to be biased positively (anodically) for a portion of a time, such that it is able to donate current, and negatively (cathodically) for another portion of time during electroplating, when it is configured to divert current and functions as a current thief. Embodiments provided herein include any of the embodiments described above, where instead of a thief cathode, an auxiliary anode, or an auxiliary anode/cathode is used.

In general, thief cathodes, auxiliary anodes, and auxiliary anode/cathodes are referred herein to as auxiliary electrodes. These include azimuthally asymmetric electrodes (such as C-shaped electrodes) and multi-segmented auxiliary electrodes.

The auxiliary anode may be an inert anode or dimensionally stable anode, for example generating oxygen gas, or it can be a metallic anode, creating metal ions of the plated metal. The auxiliary cathode may undergo metal plating thereupon during use, or may undergo another cathodic reaction, such as hydrogen evolution. Hydrogen evolution rather than metal plating can be enabled if plateable metal ions are excluded from the electrode's surface, for example, by having the auxiliary electrode exposed to a metal free solution, such as a solution containing only acids or non-plateable salts, and having the auxiliary electrode to be physically separated from the main chamber so as to avoid mixing of materials containing plating metal, but such that it is still in ionic communication with the main plating chamber (housing the wafer) via an ionically conducting media that is resistant to fluid transport (e.g. a cationic membrane).

The use of an auxiliary anode or an anode/cathode is sometimes preferable, because metal is deposited on thief cathodes during electroplating in many embodiments, which may lead to formation of stray particles, flaking of the metal, and contamination of the plating bath. In contrast, auxiliary anodes are positively biased, and deposition of metal on their surface is avoided. Further, in some embodiments, an anode/cathode, which spends more time being positively biased than negatively biased, is preferred for the same reason, i.e. there is a net anodic current and therefore no net buildup of metal on the electrode over the processing complete cycle. Such anode/cathode with a "net" anode function, would not accumulate deposits of metal on its surface, because any metal deposited on it during its cathodic phase would be redissolved during its anodic phase.

The auxiliary anodes and anode/cathodes are most preferably used in conjunction with shielding, because a shield, such as a symmetrical annular shield placed below the wafer to uniformly shield the wafer periphery, can render the surface of the wafer (e.g., at its periphery) generally deficient in plating current (a "cold" area that would result in thinner than desired plating). The primary parameter influencing the magnitude of the symmetrical annular shields' effectiveness and range of area of influence causing the edge-region-deficient plating relative to more centrally located regions of the wafer is shields' size (the shields inner-most diameter of current blocking). The asymmetry of the wafer will introduce one or more regions at one or more azimuthal positions that are more or less deficient in current than the rest of the wafer. By using an appropriately selected shield size, azimuthal regions of wafer near missing die or features can be tuned to exhibit somewhat thicker-than-average features, while simultaneously; azimuthal regions of the wafer without missing die/feature will then tend to be deficient in current and thickness. Using a shield that blocks more of the edge (smaller inner diameter) might create a situation where both the missing die regions and the general edge regions are both deficient, but the missing die region is somewhat less deficient than the general edge. Or, a shield having an inner diameter larger than both of the preceding two examples might be selected, in which case both the general edge and the missing die edge are thicker than the wafer center, but the missing die region features are the thickest on the wafer. The auxiliary "C" shaped electrode can then correct for any other these cases, i.e. both cases of excess and for deficiencies, by donating or scavenging edge plating current to a different extent and/or different sign (anodic vs. cathodic) at different azimuthal locations. The auxiliary anode/cathodes can correct this problem by donating current to a selected azimuthal positions of the wafer (during the time the anode/cathode is positively biased) and by diverting current from a different azimuthal position of the wafer (during the time the anode/cathode is negatively biased).

Figure 10A:
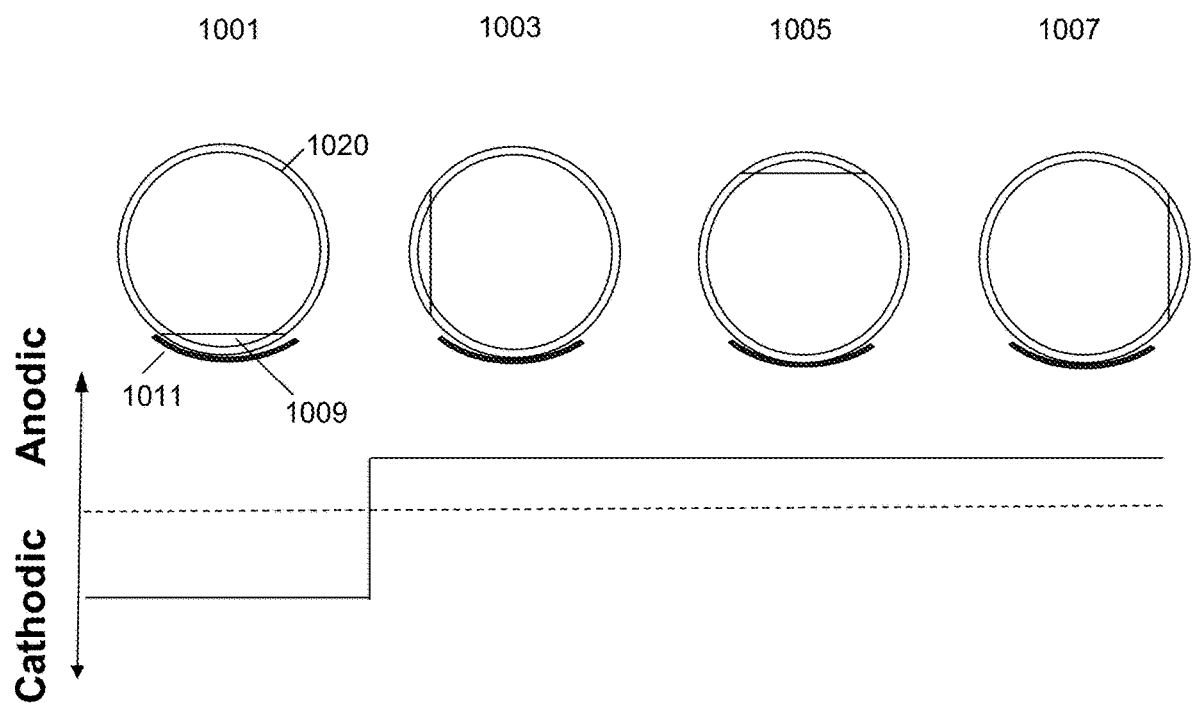
FIGS. 10A-10C illustrate rotation of an asymmetrical wafer in an apparatus having a C-shaped auxiliary electrode, energized in correlation with the wafer rotation.

FIG. 10A provides an illustration for use of a C-shaped anode/cathode for correcting azimuthal uniformity in a wafer having missing features. FIG. 10A shows four views of the wafer as it rotates wherein the shield has a moderate amount of edge extension, sized such that the missing die/feature region will be slightly thick, and the rest of the wafer edge will be slightly thin. The views 1001, 1003, 1005, and 1007 are taken at different timepoints as the wafer rotates around its central axis. The speed of the rotation can be constant (most common for this embodiment), but can also be varied, during the rotation. The graph below shows levels of anodic and cathodic currents supplied to a C-shaped auxiliary electrode over the period of the rotation and during these four time points and wafer angular positions. In view 1001, the missing die region 1009 is proximate to the C-shaped auxiliary electrode 1011. The shield 1020 is "moderate" in size, centered between creating a slightly thick region in the missing die region and slightly thin in the general edge region. Therefore, without applying corrective cathodic current, this region facing the C-shaped auxiliary electrode would end up being thick. To alleviate current crowding at the missing die area, the C-shaped electrode functions as a cathode at this point in time, and is biased negatively such as to divert the current from the missing die region. In the views, 1003, 1005, and 1007 the wafer rotates, such that the missing die region 1009 is moved away from the C-shaped auxiliary electrode 1011. At these three timepoints, the electrode is biased positively (anodically) such that it can donate current to the periphery of the wafer in its proximity. Thus, during one full rotation of the wafer, the electrode spends a portion of time biased as a cathode and a portion of time biased as an anode, and applied current levels (magnitudes) and the type (signs) of bias are correlated with the rotation of the wafer in such a way as to provide a specific correction to a selected azimuthal position of the wafer (in this case, a missing die region). The illustration shown in FIG. 10A can be used, for example, in conjunction with moderate shielding, where most portions of the wafer are "cold" (experience not sufficient current requiring donation from an auxiliary electrode), and the missing die portion is "hot" (experiences current crowding that needs to be diverted).

Figure 10B:
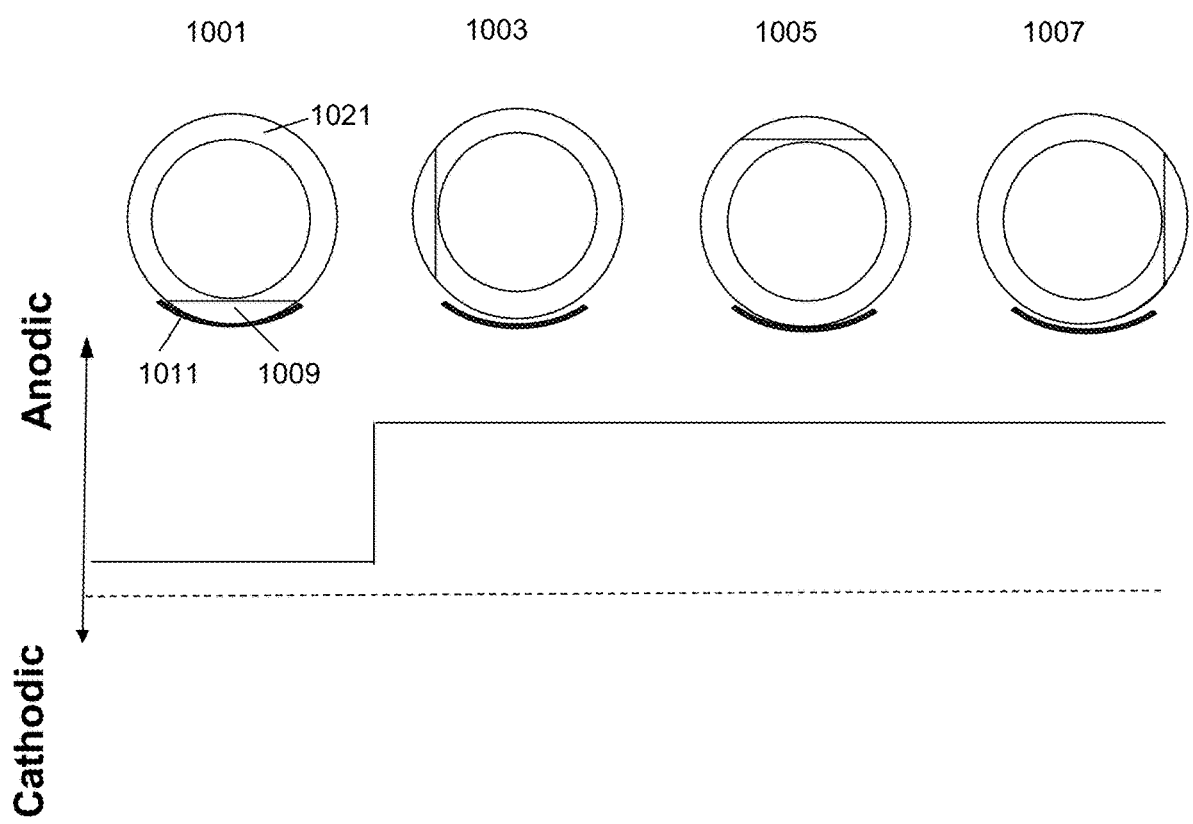

In some embodiments, for example with heavy shielding of wafer periphery, the wafer periphery may be very "cold", while the missing die refion is less "cold", such that all azimuthal positions require current donation by an auxiliary anode, but to a different extent. This is illustrated in FIG. 10B having heavy shield 1021, where the current provided to the C-shaped electrode is always anodic, but is provided at a lower level, when the missing die region (selected azimuthal position) is in the proximity of the electrode. The anodic current is increased, when the missing die region is rotated away from the electrode, such as to donate more current to colder regions of wafer periphery. Thus, during one full rotation of the wafer, the electrode spends a portion of time biased as an anode at a first power level (or current level) and a portion of time biased as an anode at a higher power level (or current level), where the current levels are correlated with the rotation of the wafer in such a way as to provide a specific correction to a selected azimuthal position of the wafer.

In some embodiments, for example when the shielding is light the cathodic current level provided to the anode/cathode may be substantially greater than an anodic current level. This is illustrated, for example, in FIG. 10C. For the same type of wafer, the light shield 1022 requires that the level of cathodic current for the missing die region would be greater than in either of the two preceding examples, and the anodic current supplied during the general edge exposure to the C-shaped electrode is much smaller (or could even also be cathodic, depending on the particulars of the wafer, shield, and cell design).

Yet in another embodiment, e.g., with little or no general symmetric shielding, the auxiliary C-shaped electrode can function as a cathode only. That is, a first level of cathodic current is supplied to the electrode when it is in the proximity of the selected azimuthal position, and a different level of cathodic current is supplied when the selected position is rotated away from the C-shaped auxiliary cathode. Thus, during one full rotation of the wafer, the electrode spends a portion of time biased as a cathode at a first power level (or current level) and a portion of time biased as a cathode at a different power level (or current level), where the power levels are correlated with the rotation of the wafer in such a way as to provide a specific correction to a selected azimuthal position of the wafer.

Note that even in the absence of a missing die or feature region, the application of current (anodic or cathodic) can be used to tune the general edge thickness distribution, and therefore, the use of the apparatus is not limited to operations with wafers having azimuthally non-uniform patterns. Rather, this design is useful for both cases of edge corrections, those having and those not having azimuthal non-uniform patterns.

Figure 10C:
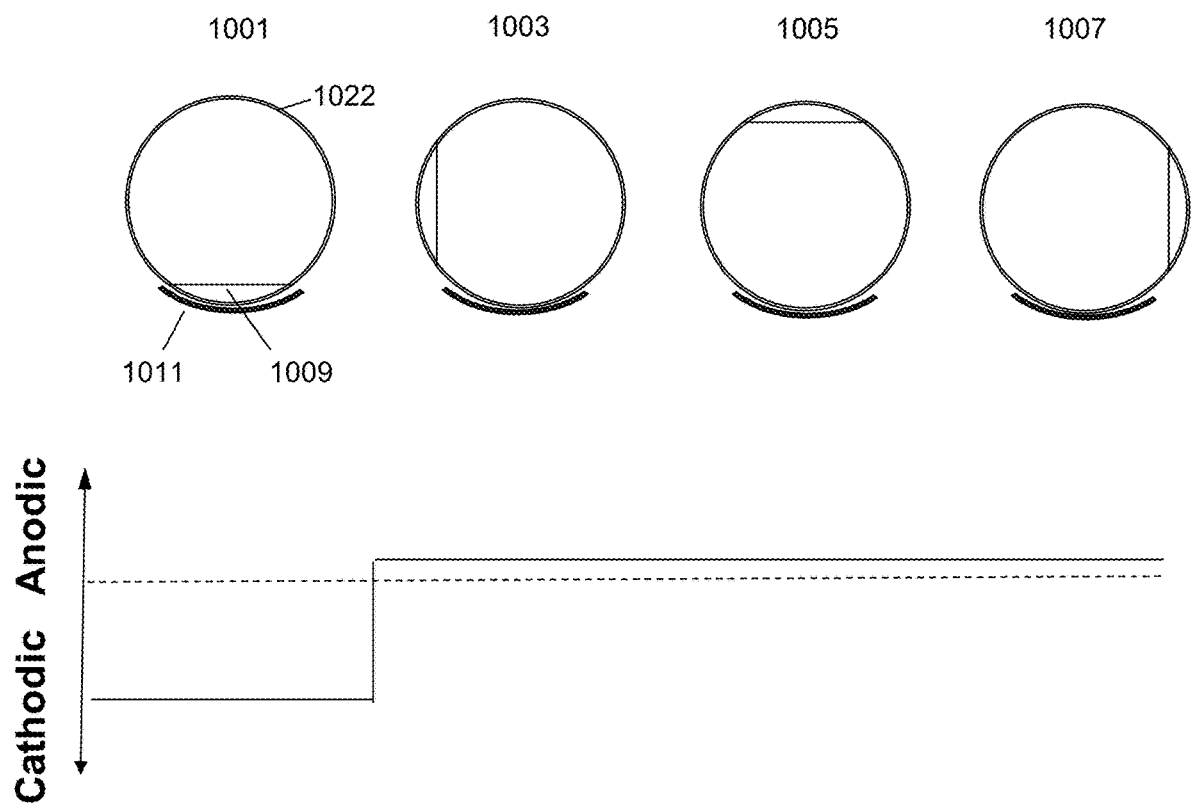

The embodiment illustrated in FIGS. 10A-10C relates to a method in which the power provided to the asymmetric auxiliary electrode is correlated with wafer rotation such as to provide a different level of plating current to a selected azimuthal position on the wafer relative a different azimuthal position (having a same average arc length and a same average radial position), and to thereby divert and/or donate plating current differently to the selected azimuthal position. The apparatus configured to perform this method of electroplating includes a controller and an associated encoder programmed to correlate power levels of the auxiliary electrode and/or polarity of the auxiliary electrode, with the position of the selected azimuthal portion of the wafer (e.g., missing die).

In an alternative embodiment, azimuthally asymmetric electrodes (e.g., C-shaped anodes, cathodes or anode/cathodes) or multi-segmented electrodes are found useful even when a constant power level is applied to them for general correction of plating current.

The position of the electrode relative to the wafer edge, and/or confinement of the auxiliary electrodes line of current, can be of significant importance. In some embodiments, it is preferable that the auxiliary electrode (such as a C-shaped anode, cathode or anode/cathode) resides in close proximity of the wafer substrate. Preferably, the distance between the substrate and the electrode should be no more than 0.2 of the radius of a circular substrate. At this distance, the electrode is particularly effective at correcting ionic current environment at the substrate surface. At larger distances, the auxiliary electrode effect will be much less pronounced because ionic current diversion/donation will be less preferentially-favored right in front of the electrode face, and diffused over a larger area of the wafer comprising many azimuthal positions, potentially making the control of the process somewhat more difficult. However, in close proximity the diversion and/or donation of current by the electrode can be focused on the specific azimuthal region that needs to be corrected. The auxiliary anodes provided herein are distinct from the azimuthally asymmetric anodes located at larger distances from the wafer.

Figure 11:
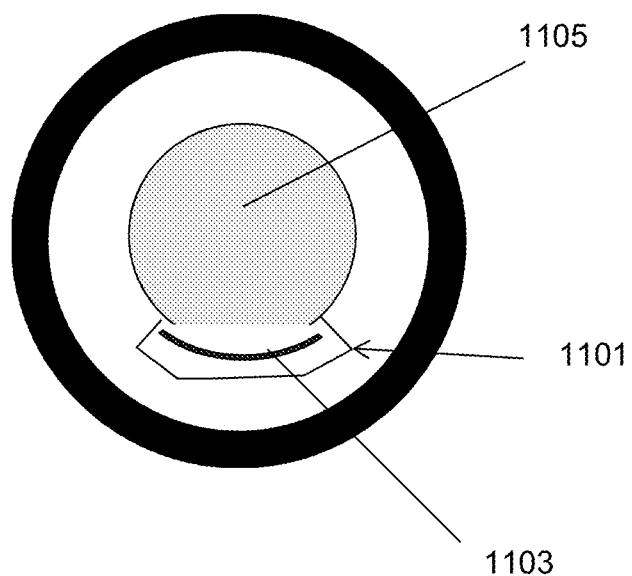
FIG. 11 shows a schematic top view of a plating cell with an azimuthally asymmetric auxiliary electrode in a confinement structure.
Figure 12:
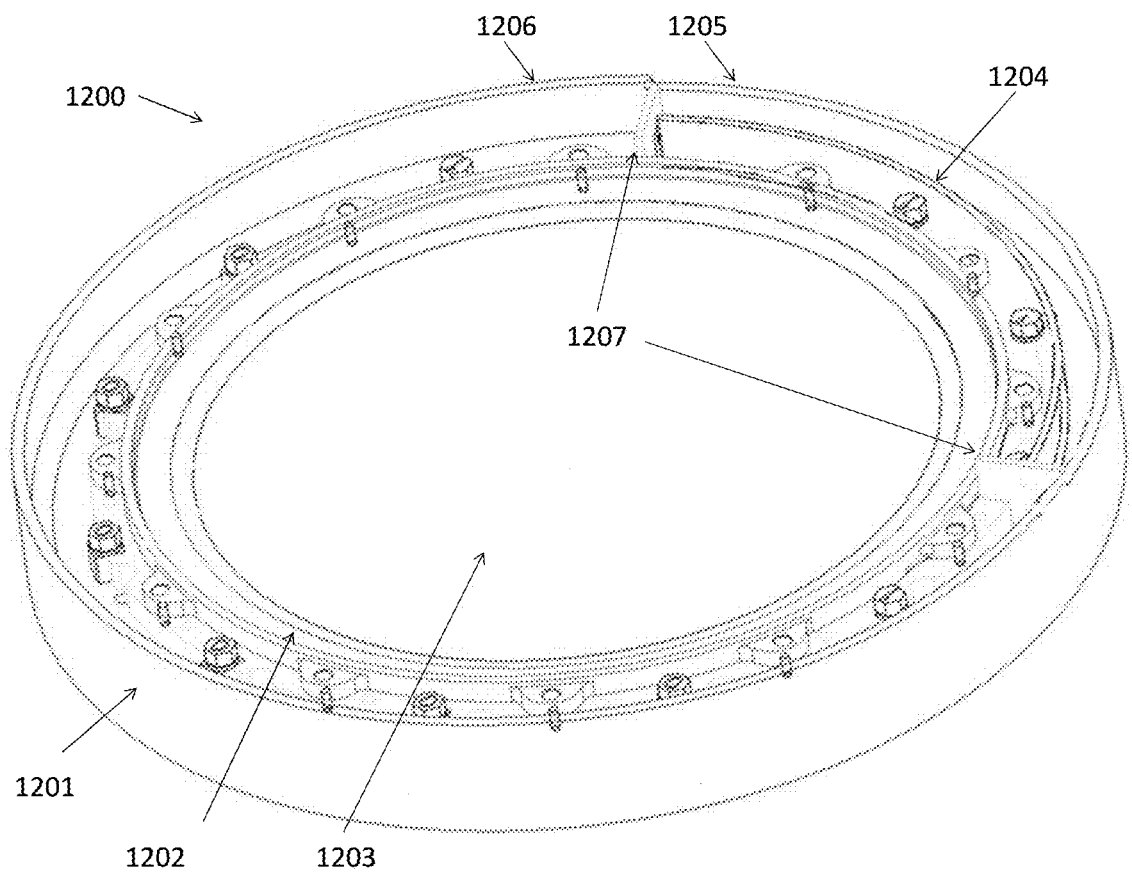
FIG. 12 shows an isometric view of a structure housing the C-shaped auxiliary electrode in accordance with an embodiment provided herein.

Alternatively, or in addition to proximity focusing described above, the auxiliary electrode may be housed in a confinement structure, which prevents the donated/diverted current from being substantially distributed in the x-y direction. A top view of the apparatus having a C-shaped auxiliary electrode 1103 in an azimuthal current flow confinement structure 1101 is shown in FIG. 11, where the confinement structure confines the exposure of current from the auxiliary electrode to a small area in the proximity of the wafer 101. An isometric view of a similar but not identical structure is shown in FIG. 12. The auxiliary electrode can also be housed in a completely separate chamber, with an electrolyte-containing channel or similar confining and angular-influence-defining region connecting it to the main plating chamber at the desired location and angular extent. Often this is referred to as the construction of a "virtual auxiliary electrode", where the positioning/location of the virtual electrode coincides with the connective channel opening of the auxiliary chamber to the main plating chamber.

It is noted that with the use of confinement or virtual chambers, the shape of the physical electrode itself becomes less important, as the shape of the diverted and/or donated current will be defined by the shape of the confinement structure housing the electrode or its opening, where the confinement structure essentially serves as a virtual auxiliary electrode.

FIG. 12 is an isometric schematic of an exemplary embodiment of a plating cell upper chamber 1200, in which a wafer and wafer holder would reside above and rotate in close proximity thereover (but the wafer and holder not shown). A cell's outer circular fluid containment body 1201 has an upper fluid confinement weir wall 1206 around most of the circumference. In the embodiment shown, the center of the cell is a HRVA plate or flow diffuser 1203 (the large number of small holes in the plate are not shown for simplicity). Around the edge of the HRVA and residing under the wafer edge is a symmetrical annular shield 1202. Over a portion of the circumference of the upper chamber is a "C" shaped auxiliary electrode 1204. In a preferred embodiment, in the area beyond auxiliary electrode 1204 (slightly more removed from the center of the cell) is a region where the upper chamber's 1200 weir wall 1206 is cut out to a slightly lower level, allowing for the preferential channeling of fluid flow across and around the solid or porous (e.g. screen) auxiliary electrode, enabling the supply of adequate convection and removal of any particles or bubbles from the cell.

Described Methods are Not Limited to Electroplating

It is understood that some aspects of the invention pertaining to the azimuthal correction described herein can be applied to many other film deposition and removal applications beyond electrodeposition, with the appropriate application and consideration of the known-in-the art differences in the physical mechanism and modus-operandi of other deposition and removal technologies. For example, a C-shaped or horse-shoe auxiliary target would be suitable to enable azimuthal variable rates of deposition on a rotating substrate, or an asymmetric physical mask placed similar to that described here, in front of a rotating wafer inside a plasma etching apparatus, would lead to an angularly controllable rate of etching at the edge and at a particular angular location on the wafer edge.

System Controller:

Electroplating apparatus as described herein includes hardware for accomplishing the process operations and a system controller having instructions for controlling process operations in accordance with the present invention. For example, a rotational digital encoder, wafer holder that rotates the wafer, any moving shield elements, HRVA, power levels applied to the auxiliary asymmetric or multi-segmented electrodes, etc. are controlled and synchronized by a system controller. The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

The invention claimed is:

1. A method of electroplating a metal on a substrate while controlling azimuthal uniformity, the method comprising:
(a) providing the substrate into an electroplating apparatus configured for rotating the substrate during electroplating, wherein the electroplating apparatus comprises a shield, configured for providing azimuthally asymmetric shielding, wherein the shield is positioned during electroplating such that a distance between the shield and a working surface of the substrate is no more than about 0.1 of the radius of the substrate; and
(b) electroplating the metal on the substrate while rotating the substrate relative to the shield such that a selected portion of the substrate at a selected azimuthal position dwells in a shielded area for a different amount of time than a second portion of the substrate having the same average arc length and the same average radial position and residing at a different angular azimuthal position.

2. The method of claim 1, wherein the shield is positioned during electroplating such that a distance between the shield and a working surface of the substrate is no more than about 4 mm.

3. The method of claim 2, wherein the shield is an annular shield having an irregular portion.

4. The method of claim 1, wherein (b) comprises rotating the substrate at a variable speed.

5. The method of claim 1, wherein (b) comprises rotating the substrate at a first speed when the selected portion of the substrate is less shielded and at a second speed when the selected portion of the substrate is more shielded, wherein one full rotation of the substrate comprises a first period of rotation at the first speed and a second period of rotation at the second speed.

6. The method of claim 5, wherein the second speed is lower than the first speed.

7. The method of claim 5, wherein the first speed is at least about 20 rpm and the second speed is less than about 10 rpm.

8. The method of claim 5, wherein the substrate makes at least five full rotations with variable speed during the course of electroplating.

9. The method of claim 1, wherein (b) comprises rotating the substrate bidirectionally, such that the selected portion of the substrate dwells in the shielded area for a different amount of time than a second portion of the substrate having the same average arc length and the same average radial position and residing at a different angular azimuthal position.

10. The method of claim 1, wherein the electroplating apparatus further comprises an ionically resistive ionically permeable element positioned such that it is separated from a working surface of the substrate by a distance of about 10 mm or less during electroplating.

11. The method of claim 10, wherein the ionically resistive ionically permeable element comprises a plurality of non-communicating channels, wherein the shield eclipses a portion of the non-communicating channels.

12. The method of claim 1, wherein the shield is an ionically resistive ionically permeable element having a plurality of channels, wherein the element has an azimuthally asymmetric distribution of channels.

13. The method of claim 1, further comprising registering a selected azimuthal position on the substrate prior to electroplating.

14. The method of claim 1, wherein the shield is an annular shield having a portion departing from annularity.

15. A method of electroplating a metal on a substrate while controlling azimuthal uniformity, the method comprising:
(a) providing the substrate into an electroplating apparatus configured for rotating the substrate during electroplating, wherein the electroplating apparatus comprises a shield, configured for providing azimuthally asymmetric shielding, wherein the shield is an ionically resistive ionically permeable element having an azimuthally asymmetric distribution of channels; and
(b) electroplating the metal on the substrate while rotating the substrate relative to the shield such that a selected portion of the substrate at a selected azimuthal position dwells in a shielded area for a different amount of time than a second portion of the substrate having the same average arc length and the same average radial position and residing at a different angular azimuthal position.

16. The method of claim 15, wherein (b) comprises rotating the substrate at a first speed when the selected portion of the substrate is less shielded and at a second speed when the selected portion of the substrate is more shielded, wherein one full rotation of the substrate comprises a first period of rotation at the first speed and a second period of rotation at the second speed.

17. The method of claim 15, wherein the second speed is lower than the first speed.

18. The method of claim 15, wherein (b) comprises rotating the substrate bidirectionally, such that the selected portion of the substrate dwells in the shielded area for a different amount of time than a second portion of the substrate having the same average arc length and the same average radial position and residing at a different angular azimuthal position.

19. The method of claim 15, further comprising registering a selected azimuthal position of the substrate before electroplating.

* * * * *